US012701776B2

(12) United States Patent
Udrea et al.

(10) Patent No.: US 12,701,776 B2
(45) Date of Patent: Aug. 4, 2026

(54) POWER SEMICONDUCTOR DEVICE COMPRISING A WIDE BANDGAP SUBSTRATE

(71) Applicant: Cambridge GaN Devices Limited, Cambridge (GB)

(72) Inventors: Florin Udrea, Cambridgeshire (GB); Loizos Efthymiou, Cambridgeshire (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 446 days.

(21) Appl. No.: 18/324,319

(22) Filed: May 26, 2023

(65) Prior Publication Data

US 2024/0395804 A1     Nov. 28, 2024

(51) Int. Cl.
| | |
|---|---|
| *H10D 84/80* | (2025.01) |
| *H10D 8/60* | (2025.01) |
| *H10D 30/47* | (2025.01) |
| *H10D 62/10* | (2025.01) |
| *H10D 62/832* | (2025.01) |
| *H10D 62/85* | (2025.01) |
| *H10D 64/00* | (2025.01) |

(52) U.S. Cl.
CPC ............. *H10D 84/811* (2025.01); *H10D 8/60* (2025.01); *H10D 30/475* (2025.01); *H10D 62/111* (2025.01); *H10D 62/8325* (2025.01); *H10D 62/8503* (2025.01); *H10D 64/111* (2025.01)

(58) Field of Classification Search
None
See application file for complete search history.

(56) References Cited

U.S. PATENT DOCUMENTS

| | | | | |
|---|---|---|---|---|
| 8,390,091 | B2 | 3/2013 | Renaud | |
| 9,087,812 | B2* | 7/2015 | Briere | H10D 30/4755 |
| 2008/0315257 | A1* | 12/2008 | Shiraishi | H10D 84/811 |
| | | | | 257/195 |
| 2009/0166677 | A1 | 7/2009 | Shibata et al. | |
| 2011/0147762 | A1 | 6/2011 | Sheppard | |
| 2012/0199940 | A1 | 8/2012 | Mazzola | |
| 2013/0328063 | A1 | 12/2013 | Yamazaki | |
| 2013/0341641 | A1* | 12/2013 | Nishiwaki | H10D 84/08 |
| | | | | 257/77 |
| 2014/0367700 | A1 | 12/2014 | Prechtl et al. | |

(Continued)

OTHER PUBLICATIONS

Search Report and Written Opinion for LU application No. LU504335, dated Dec. 20, 2023, 18 pages.

(Continued)

*Primary Examiner* — Nilufa Rahim
(74) *Attorney, Agent, or Firm* — Tarolli, Sundheim, Covell & Tummino LLP

(57) ABSTRACT

A power device comprising a substrate, a first wide bandgap semiconductor material positioned over the substrate, wherein the substrate comprises a second wide bandgap semiconductor material different from the first bandgap semiconductor material, a high voltage transistor formed in the first wide bandgap semiconductor material, and a high voltage diode associated with the substrate, wherein at least part of the high voltage diode is positioned below at least part of the high voltage transistor. The high voltage diode comprises a drift region, the drift region formed in the second-wide bandgap material.

15 Claims, 23 Drawing Sheets

(56) References Cited

U.S. PATENT DOCUMENTS

| | | | |
|---|---|---|---|
| 2016/0181240 A1 | 6/2016 | Mauder et al. | |
| 2017/0040312 A1 | 2/2017 | Curatola et al. | |
| 2021/0104623 A1 | 4/2021 | Sriram | |
| 2021/0167199 A1 | 6/2021 | Sriram | |
| 2021/0305417 A1 | 9/2021 | Kim et al. | |
| 2022/0344500 A1 | 10/2022 | Sriram | |
| 2023/0378163 A1* | 11/2023 | Chen | H10D 84/811 |

OTHER PUBLICATIONS

GB Search Report for GB application No. GB2407078.1, dated Dec. 23, 2024, 18 pages.

Lyu, et al., "GaN on Engineered Bulk Silicon Power Integration Platform With Avalanche Capability Enabled by Built-in Si PN Junctions", IEEE Electron Device Letters (2022) vol. 43, No. 11, pp. 1826-1829.

Kaminski, et al., "SiC and GaN devices—wide bandgap is not all the same" IET Circuits, Devices & Systems, (2014) vol. 8, issue 3, pp. 227-236 doi:10.1049/iet-cds.2013.0223.

Hult, "Design, Fabrication and Characterization of GaN HEMTs for Power Switching Applications" Thesis for the Degree of Licentiate of Engineering, (2022), Chalmers University of Technology, Department of Microtechnology and Nanoscience—MC2, Microwave Electronics Laboratory, 80 pages ISSN 1652-0769.

Lyu, et al., "GaN on Engineered Bulk Si (GaN-on-EBUS) Substrate for Monolithic Integration of High-/Low-Side Switches in Bridge Circuits", IEEE Transactions on Electron Devies (2022) vol. 69, No. 8, pp. 4162-4169.

Lyu, et al., "A GaN Power Integration Platform Based on Engineered Bulk Si Substrate with Eliminated Crosstalk between High-Side and Low-Side HEMTs", IEEE Electron Device Meeting (2021) vol. 5.2, pp. 1-5 doi: 10.1109/IEDM19574.2021.9720505.

Lyu, et al., "Substrate and Trench Design for GaN-on-EBUS Power IC Platform", IEEE Transactions on Electron Devies (2022) vol. 69, No. 7, pp. 3641-3647.

* cited by examiner

POWER SEMICONDUCTOR DEVICE COMPRISING A WIDE BANDGAP SUBSTRATE

FIELD OF THE DISCLOSURE

The present disclosure relates to semiconductor devices. Particularly, but not exclusively, the disclosure relates to hetero-structure AlGaN/GaN high electron mobility transistors or rectifiers.

BACKGROUND OF THE DISCLOSURE

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems.

Additionally, GaN with its wide bandgap offers the potential for emitting light at higher frequencies for example the green, blue, violet, and ultraviolet portions of the electromagnetic spectrum.

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm2/(Vs)) values. In addition, the piezopolarization charge present at the AlGaN/GaN heterostructure, results in a high electron density in the 2DEG layer (e.g. 1×1013 cm−2). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). Where specific Rds(ON) is often the product of the resistance of a device times the area of the device on wafer. An extensive amount of research has focused on the development of power devices using AlGaN/GaN heterostructures.

Layers which constitute the AlGaN/GaN heterojunction transistor are often epitaxially grown on a substrate from a different material for example Silicon, Silicon Carbide or Sapphire. Epitaxial growth of GaN on different substrates has advantages and disadvantages both in terms of the difficulty and cost of growing high quality layers and in terms of device performance. A non-exhaustive list of things to consider when choosing a suitable substrate is: substrate lattice constant mismatch with GaN, substrate thermal expansion coefficient mismatch with GaN, substrate cost, substrate thermal conductivity etc.

Silicon Carbide (SiC) has excellent thermal conductivity (almost three times that of silicon), and therefore GaN-on-SiC is an option which is receiving increasing interest for high power applications. SiC, is also a wide bandgap material which is used to develop power devices. The critical electric field of SiC is comparable to GaN (3.5 MV/cm and 3.3 MV/cm, respectively) and therefore it can also sustain higher voltages in smaller dimensions compared to Silicon. Additionally, SiC has a smaller lattice constant mismatch with GaN compared to Silicon with GaN. Therefore, the growth of epitaxial layers of GaN-on-SiC is less challenging compared to the growth of epitaxial layers of GaN-on-Silicon. GaN-on-Silicon epitaxial growth often comprises a transition layer to manage the stress, warping etc. and achieve high quality material. In GaN-on-SiC, only a thinner AlN nucleation layer is required.

The SiC substrate used in GaN-on-SiC devices may be a monocrystalline 4H—SiC, 6H—SiC or 3C—SiC substrate. The substrate may be doped to be conductive or may be semi-insulating. 4H—SiC is the most commonly available polytype.

In a GaN-on-SiC lateral heterojunction transistor the off-state potential exists both laterally and vertically/longitudinally. As used herein, laterally, refers to the dimension between the gate and drain terminal, where gate and drain contacts are both placed on the surface of the wafer. Vertically or longitudinally meanwhile refers to the perpendicular dimension between the drain and substrate contact. These dimensions are illustrated in e.g. FIG. 1 which shows a GaN-on-SiC HEMT positioned (vertically or longitudinally) above a SiC substrate. The backside of the wafer is often connected to the source potential, often at package level.

In existing device, the SiC substrate in a GaN-on-SiC device is generally not electrically utilised i.e. it is not used to conduct any current in the normal operation of the device. Additionally, the substrate does not sustain a significant voltage drop across it during the off-state operation of the device. The entire SiC substrate therefore acts as a field pate, virtually taking the substrate potential which is often grounded. In that sense, the SiC substrate may be described as offering a mechanical and thermal function but not necessarily an electrical function (or high voltage) in the operation of the device.

As a result, in such devices the majority or even the entirety of the vertical potential drop is observed in the III-nitride epitaxial layers.

Where a semi-insulating SiC substrate is used, the substrate does have a voltage drop across it. This allows the development of device with thinner GaN-based layers. However, semi-insulating SiC substrates are more expensive and less common than doped SiC substrates. In addition, the semi-insulating substrate is used in a similar manner to a dielectric material and therefore does not feature or does not behave as an active semiconductor device such as a diode or transistor. There are advantages in using diode or transistors incorporated in the substrate as described as part of this disclosure.

When a monocrystalline doped SiC substrate is used, and it is connected to source potential, the potential drop during the blocking/off-state mode of operation of the HEMT is sustained almost entirely in the III-nitride epitaxial layers and in particular a GaN buffer layer. If vertical breakdown is the limiting factor, in order to increase the vertical breakdown of a device, the thickness of the GaN buffer layer is often increased which increases the cost and complexity of epitaxial growth. This also applies to GaN-on-Si devices.

An additional challenge in GaN HEMT is their lack of avalanche capability. Avalanche capability may be beneficial in a power device as it limits the maximum potential that can develop between the high voltage and low voltage terminals of a device, and therefore can limit the maximum electric field in the structure. This may provide reliability advantages, in terms of device lifetime as over-voltages in operation are limited. Because of the lack of avalanche capability, GaN HEMT can often be over engineered in terms of the actual breakdown being much higher than the rated breakdown. This is often done by having larger dimensions (e.g. lateral distance between gate and drain and increased thickness of the GaN stack), resulting in wasted material and increased costs.

Finally, while GaN HEMTs have efficient forward conduction (drain biased positively with respect to source and the gate voltage above the threshold voltage) with low on-state losses, the reverse conduction (when the source and gate potentials are the same and the source is positively biased with respect to the drain is relatively poor, with significant steady-state losses due to a large drop between the source and drain terminal for a given reverse current level.

US2021/0104623 A1 describes a device including a source electrically coupled to a group III-nitride barrier layer; a gate electrically coupled to the group III-nitride barrier layer; a drain electrically coupled to the group III-nitride barrier layer; and a p-region being in the substrate or on the substrate below the group III-nitride barrier layer.

US2021/0167199 A1 describes an apparatus to address gate lag effect and/or other negative performance with a p-region that extends toward a source side of a substrate and towards a drain side of the substrate.

US2022/0344500 A1 describes a high-electron mobility transistor includes a substrate layer, a first buffer layer provided on the substrate layer, a barrier layer provided on the first buffer layer, a source provided on the barrier layer, a drain provided on the barrier layer, and a gate provided on the barrier layer.

U.S. Pat. No. 8,390,091 B2 describes a structure that includes a vertical Schottky diode, including an anode; a cathode including the substrate, and a Schottky barrier between the cathode and the anode, the Schottky barrier being situated between the substrate and an anode layer in a stack of layers.

SiC and GaN devices—wide bandgap is not all the same (Kaminski et al), IET Circuits Devices & Systems, 2014, Vol. 8, Iss. 3, pp. 227-236, contains discussions regarding the use of various materials in semiconductor devices.

Design, Fabrication and Characterization of GaN HEMTs for Power Switching Applications (Björn Hult), Microwave Electronics Laboratory, Department of Microtechnology and Nanoscience, Chalmers University of Technology, 2022, contains discussions of AlGaN/GaN-on-SiC high voltage metal-insulator semiconductor (MIS) HEMTs fabricated on 'buffer-free' heterostructures.

SUMMARY

It is the object of this invention to provide power device comprising a heterojunction transistor such as a high-voltage HEMT on an active SiC substrate which features a high voltage diode, to thereby provide an efficient design facilitating an improved trade-off between on-state and breakdown of the power device. Power devices according to the present disclosure may further be configured to offer avalanche capability, as well as an efficient reverse conduction path leading to lower losses during reverse conduction.

Thus, in a device according to the present disclosure, the high voltage diode participates actively to support laterally and vertically a large fraction of the off-state high voltage between the drain and the source of the heterojunction transistor.

The main terminals of the power device, such as the source, drain and gate terminals can be the same as those of the heterojunction transistor and serve to connect the power device to other external devices/circuits or electrical rails such as drivers, controllers, high voltage or ground rails. Additional terminals can be present within the power device and these terminals can be operatively connected to the diode terminals. Alternatively, the high voltage diode terminals, anode and cathode can be the same or operatively connected (for example through metallization layers) to source and drain terminals respectively such that the high voltage diode is placed in an anti-parallel configuration with the heterojunction transistor.

According to a first aspect of the invention, there is provided a power device comprising: a substrate; a first wide bandgap semiconductor material positioned over the substrate, wherein the substrate comprises a second wide bandgap semiconductor material different from the first bandgap semiconductor material; a high voltage transistor formed in the first wide bandgap semiconductor material; a high voltage diode associated with the substrate, wherein at least part of the high voltage diode is positioned below at least part of the high voltage transistor; and wherein the high voltage diode comprises a drift region, the drift region formed in the second wide bandgap semiconductor material.

In other words, the power device comprises a first wide bandgap semiconductor placed above a substrate which comprises a high voltage diode made in a second wide bandgap semiconductor, different from the first bandgap semiconductor. Part of the diode is placed directly under part of the power device and is configured to support a large fraction of the voltage between the terminals of the power device.

In one implementation, a wide bandgap semiconductor may be a semiconductor with a bandgap of at least 2 eV. Examples of such wide bandgap semiconductors include, non-exhaustively, GaN, AlGaN, AlN, GaO, SiC and Diamond.

In one implementation, a high voltage may be a voltage between 30V and 10 kV.

In one implementation, a "large fraction of the high voltage" may be a voltage between 20% to 100% of the total voltage between the main terminals of the power device (i.e. the drain and source).

The power device may preferably comprise a lateral heterojunction transistor such as a HEMT, and the first wide bandgap semiconductor may be based on III-Nitride. The first wide bandgap semiconductor may comprise a heterojunction between a GaN layer and a AlGaN layer. The substrate may be formed of or comprise doped SiC (such as 4H SiC, 6H SiC or 3C SiC). For example, the substrate may be formed from a combination of a semi-insulating SiC substrate and a doped SiC.

Alternatively, the first wide bandgap semiconductor may comprise GaO, AlN or AlGaN, or other suitable wide bandgap semiconductor material, while the transistor may be a MOFSET, MESFET, deep depletion FET, or other suitable transistor.

The second wide bandgap semiconductor may alternatively comprise GaN, AlN or Diamond, or other suitable wide bandgap semiconductor material.

According to a second aspect of the invention, there is provided a III-nitride power semiconductor device comprising:

a heterojunction transistor, the heterojunction transistor comprising:

an active III-nitride semiconductor region comprising a heterojunction formed between a GaN layer and a AlGaN layer;

a drain terminal operatively connected to the active III-nitride semiconductor region;

a source terminal laterally spaced from the drain terminal and operatively connected to the active III-nitride semiconductor region; and a gate terminal positioned over the active III-nitride semiconductor region, the gate terminal being formed between the drain terminal and the source terminal; and a substrate, wherein the substrate comprises a monocrystalline SiC material and a high voltage diode, the high voltage diode comprising a cathode terminal and an anode terminal.

The heterojunction transistor is positioned over the substrate such that the high voltage diode is located below at least part of the heterojunction transistor.

While the following description is restricted to a device comprising a HEMT, GaN/AlGaN heterojunction and SiC substrate, it will be understood that more broadly embodiments of the invention may comprise other wide bandgap materials and transistors as described above.

The high voltage diode comprises a drift region configured to block most or at least part of the voltage when the diode is in a reverse bias mode (i.e. the cathode is positively biased with respect to anode).

At least part of the drift region may sit directly under and in physical contact with the active III-nitride semiconductor region, and therefore participates directly to support both laterally and vertically a high voltage or a fraction of the high voltage between the drain terminal of the heterojunction transistor and the anode terminal of the diode, when the heterojunction is in the blocking mode or during the transient states.

In embodiments, an AlGaN/GaN heterojunction device on a SiC substrate is provided, with a diode incorporated in the SiC substrate. The heterojunction transistor can be a HEMT. The HEMT can achieve a more effective potential distribution during the blocking mode (OFF-state bias) or during transients (from low voltages to high voltages or opposite) through a more effective use of the SiC substrate, compared to existing AlGaN/GaN HEMTs. More effective use means that the SiC substrate may be electrically utilised as a high voltage region, by seeing a substantial part of the potential drop between the high voltage terminal and the low voltage terminal in the device off-state. This is achieved through a diode based on a high voltage junction in the SiC substrate layer. The junction may be part of a p-n diode. Alternatively, a diode based on a p-i-n or p+/p−/n+ or p+/n−/n+ junction, a diode based on a Superjunction or a Schottky diode may be used. Bipolar diodes such as p-n or P-I-N or p+/p−/n+ or n+/p−/p+ junction have generally lower leakage currents and require ohmic metallization. Schottky diodes have relatively higher leakage currents and require at least one non-ohmic, Schottky contact with either the anode or cathode terminal. The Schottky diodes however feature unipolar conduction in the forward on-state and this results in very fast switching (associated with zero reverse recovery losses if the diode is used in anti-parallel configuration with the HEMT). Combinations of bipolar/Schottky diodes such as Junction Barrier diodes or Merged Schottky-bipolar diodes (also known as Merged p-n Schottky diodes) can also be used.

The incorporation of a SiC diode under at least part of the HEMT device facilitates a design with an improved specific ON-state resistance, as the dimensions of the GaN HEMT do not need to be over engineered.

Moreover, the effective use of the SiC substrate as a region can allow substantially thinner GaN based layers (such as GaN buffer layer or no GaN buffer layer at all). This is advantageous both from a cost perspective and reduced process complexity perspective. Furthermore, since the voltage is laterally distributed within the heterojunction transistor with little or virtually no vertical component, there is less risk of traps being ionized in the GaN buffer which could create reliability issues such as Dynamic Ron increase.

Due to increasing OFF-state bias voltage, impact ionization in the depletion region of the reverse biased diode in the SiC substrate will lead to avalanche breakdown. The reverse biased diode in the SiC substrate may be designed to reach avalanche breakdown before other modes of breakdown in the HEMT (such as soft breakdown due to leakage currents, or static or time-dependent dielectric breakdown) occur in the nitride epitaxial layers or the passivation/dielectric layers in the device, or vertically between the surface terminals and the substrate terminal. If the SiC diode is used in anti-parallel configuration with the HEMT, the HEMT-diode combination breakdown will be limited by the SiC diode breakdown. The SiC diode will be able to dissipate energy during avalanche and thus providing the power device (the HEMT-diode combination) with avalanche capability. Having avalanche capability is highly desirable in some power electronics application, for example because if the surge energy of the device is not exceeded, then avalanche breakdown is recoverable. On the other hand, other modes of breakdown which may occur in conventional GaN HEMT device, such as dielectric breakdown, are not recoverable.

As already mentioned, the diode in the SiC substrate, under the HEMT can also be used in anti-parallel configuration with the GaN HEMT. If a p+/p−/n+ or p+/n−/n+ diodes are used the cathode terminal of the diode can be connected to the drain terminal of the HEMT while the anode terminal of the diode can be connected to the source terminal of the HEMT. If a p+/p−/n+ diode is used, the anode terminal may be connected to the backside of the SiC substrate (i.e. as the substrate terminal). If a p+/n−/n+ diode is used, the cathode terminal for the p+/n−/n+ diode may be connected on the backside of the substrate (i.e. as the substrate terminal). In either of the two cases mentioned, the SiC diode can be used therefore in a forward-biased mode when the HEMT is in a reverse conduction state. In this configuration, the common source terminal is more positively biased than the drain terminal. In this condition, the SiC diode is forward biased and provides a parallel conduction path to that existing between the source and drain terminals of the HEMT (through the 2DEG layer). The SiC diode can be more effective (offering lower on-state voltage drop or lower equivalent on-state resistance) in the forward-biased mode than the parallel 2DEG channel in a reverse conduction mode, thus minimising the on-state losses in this mode of operation. The SiC diode can also take a surge of current, if needed, during this mode of operation.

If the SiC diode is largely unipolar and based on a Schottky barrier, then it produces negligible extra charge during reverse conduction and can be very fast during switching leading to very little (negligible) reverse recovery losses.

Furthermore, the parasitic input and output capacitances in the GaN HEMT limit the losses and speed during the transient signals (in particular during the turn-on process). By providing a depletion region in the SiC diode under the GaN HEMT, the capacitances (in particular the output capacitance) can be minimised. The large body of the depletion region in SiC, present at higher voltages in the drift region, when the SiC is reverse biased directly under the III-nitride semiconductor region leads to a small capacitance, minimising the switching losses and switching time.

Thus, according to an aspect of the invention, there is provided a power semiconductor device comprising a GaN HEMT featuring at least three terminals, source, drain and gate and having at least one GaN layer and at least one AlGaN layer and at least one heterojunction formed between the at least one GaN layer and the at least one AlGaN layer, wherein the GaN HEMT is located above a monocrystalline SiC substrate, wherein the monocrystalline SiC substrate comprises a high voltage diode which features two terminals, anode and cathode, wherein the SiC diode comprises a drift region, and at least part of the drift region is directly located under at least part of the heterojunction transistor.

Part of the drift region is physically arranged directly under the active III-Nitride semiconductor region, thus during the blocking mode the voltage is shared laterally in the active III-Nitride semiconductor region as well as the SiC drift region. The SiC drift region is also responsible for taking a large fraction of the vertical voltage between the drain and source terminals of the power device (for e.g. when the source terminal is connected to the anode terminal of the high voltage diode). In a preferred embodiment virtually all the vertical voltage is supported within the drift region of the SiC diode.

In one example, the heterojunction transistor may comprise one or multiple heterojunctions with one or multiple active 2DEG channels. "Active" here may describe that during ON-state operation of the HEMT, the current flows through at least one or multiple 2DEG channels.

In one example of this invention, the high voltage SiC diode comprises a drift region (or a high voltage region that blocks the voltage, when the diode is reverse biased), wherein at least part of the drift region is directly located under part of the active area of the HEMT region (by "active region" it is meant the area where on-state conduction takes place) and in physical contact with the III-Nitride semiconductor region. When the HEMT is in the blocking mode (a high voltage is applied to its drain with respect to its source), the high voltage diode is in reverse bias (cathode is positively biased against the anode), blocking a substantial fraction of the blocking voltage within its drift region.

In one example, the drift region of the high voltage diode in SiC may comprise a p-type doped region. When the GaN HEMT is supporting a high voltage across its drain to source terminals, the said diode is reverse biased, and it supports a large depletion layer within the p-type region. At least part of the depletion layer may be formed directly under the active area of the HEMT (in physical contact with the III-nitride semiconductor region) and contributes to support the voltage vertically between the drain terminal of the HEMT and the anode terminal of the diode.

In other examples, the drift region of the high voltage diode in SiC may comprise an n-type doped region. When the GaN HEMT is supporting a high voltage across its drain to source terminals, the said diode is reverse biased and it supports a large depletion layer within the n-type region. Similar to the previous example, at least part of the depletion layer may be formed directly under the active area of the HEMT (in physical contact with the active III-Nitride semiconductor region) and contributes to support the voltage vertically between the drain terminal of the HEMT and the anode terminal of the diode.

In the examples described the p-type or n-type doping region dimensions (e.g. depth) and doping levels may be designed to support a large (desirable) voltage between the anode and cathode terminals of the diode.

In one example of this invention, the cathode terminal of the diode and the drain terminal of the HEMT may be electrically connected together and/or the anode terminal of the diode and the source terminal of the HEMT may be electrically connected together. In this example, the SiC diode may be used as an anti-parallel diode for the HEMT, and the said SiC diode can become forward-biased when the HEMT operates in the reverse conduction mode (i.e. a third quadrant operation).

In some examples, the said anti-parallel diode may be used for an extra current path during the reverse conduction of the HEMT either as a main anti-parallel diode or as a surge diode or as a diode in parallel with the intrinsic reverse conduction structure of the GaN HEMT.

Additionally, during off-state operation the breakdown of the combination of the GaN HEMT and the high voltage SiC diode may be limited by the avalanche of the SiC diode. Therefore, the SiC diode may be described as offering avalanche capability to the GaN HEMT.

In another example, the said cathode terminal may not be connected directly to the drain terminal but instead being connected through a potential divider to the drain terminal or be connected to a fixed high voltage rail. In another example, the anode terminal of the said diode is connected to a low voltage DC terminal.

In some examples, the anode terminal of the high voltage diode may be connected to the backside of the SiC substrate. The anode terminal may comprise a back metallization contact. This is particularly the case if a highly doped p+ substrate (first conductivity type) is used, or a layer of p+ is implanted on the backside of the substrate.

In other examples, the anode terminal of the diode may be connected to the front side of the SiC substrate.

In other examples, the cathode terminal of the high voltage diode may be connected to the backside of the SiC substrate. The cathode terminal may comprise a back metallization contact. This is particularly the case if a highly doped n+ substrate (second conductivity type) is used, or a layer of n+ is implanted on the backside of the substrate.

Additional examples may comprise at least one additional n-type or p-type doped region formed at the surface of the SiC substrate and directly above at least part of the said p-type or n-type doped drift regions and wherein the at least one additional n-type or p-type regions are more highly doped than the n-type or p-type drift regions and where at least one of the cathode or anode terminals connect electrically to the at least one of the additional n-type or p-type regions respectively. The additional n-type and p-type regions may be described as n+ layer or p+ layer respectively.

Additional examples may comprise at least one additional p-type or n-type doped region directly below at least part of the p-type or n-type drift regions and wherein the at least one additional p-type or n-type regions is more highly doped than the said n-type or p-type drift region and wherein an anode or a cathode terminal connects electrically to the at least one p-type region or n-type region respectively. The additional p-type and the n-type region may be referred to as a p+ or n+ layers respectively.

In some examples, the cathode terminal may form at least in part a Schottky contact to the SiC substrate, such that a Schottky diode is built between the anode and cathode terminals.

In other examples, the anode terminal may form at least in part a Schottky contact to the SiC substrate, such that a Schottky diode is built between the anode and cathode terminals.

The Schottky terminal may be based on an energy (voltage) barrier formed between a metal (with a specific work function) and a semiconductor substrate.

The Schottky diode in examples described, may also be a Junction barrier diode, or merged bipolar-Schottky diode, wherein the Schottky contacts are placed between adjacent p+ or n+ rings or regions (to minimize leakage currents within the diode itself). In another example, the SiC substrate may contain a superjunction structure formed of alternating n/p stripes (for example as a stack of layers comprising at least one p and at least one n stripe), arranged vertically on top of each other from the top of surface of the SiC substrate down towards the backside of the substrate and directly below at least part of the GaN HEMT. The high voltage SiC diode may feature an anode and cathode terminal and the SiC superjunction described. The superjunction may be designed for charge compensation, wherein the charge contribution for the at least one 2DEG layer is considered, as well as any other existing charges within the GaN HEMT.

In some examples, a power device or multiple (i.e. two or more) power devices may comprise multiple heterojunction transistors on a common SiC substrate comprising at least one high voltage diode. The multiple heterojunction transistors, may be two HEMTs connected in a half bridge featuring a common SiC diode underneath, or featuring two different SiC diodes with different cathode terminals but a single anode terminal.

The substrate may comprise an insulating substrate such as sapphire or quartz or semi-insulating SiC layer below the high voltage diode.

The use of a dielectric layer or the semi-insulating SiC layer placed within the substrate may be useful if multiple individual heterojunction transistors (e.g. multiple GaN HEMTs) could be monolithically integrated and isolated from each other by being formed into different active areas. Isolation regions between active areas could comprise trenches, filled with dielectric materials or by appropriately doped regions in GaN layers to disable the 2DEG layers. Isolation regions could reach the semi-insulating substrate, In another example, additional low-voltage devices or circuits, are integrated either in in the GaN layers or the SiC substrate adjacent to the HEMT device or adjacent to the diode built in SiC. The low-voltage devices or circuits may comprise, non-exhaustively, any one or more of Miller clamps, sensing and protection circuits or driver circuits.

In all the examples above the diode embedded in the substrate SiC substrate may have a combined lateral-vertical configuration, meaning that the drift region placed directly under and in direct contact with the active III-nitride semiconductor can support the voltage both laterally and vertically. The potential lines could curve (bend) from a lateral dimension within the active III-nitride semiconductor region towards the surface of the substrate (i.e. the interface between the active III-Nitride region and the substrate) to gradually become vertical within the bulk of the SiC substrate between a surface terminal and a back-side terminal. That is to say that potential lines are continuous but gradually changing direction from the HEMT blocking region to the drift region within the SiC diode in the substrate.

In another embodiment the drift region of the diode is made in the SiC substrate while the anode and cathode layers are made in GaN. For example, a highly doped p-GaN layer (p+ GaN) can be used as an anode layer, while the drift region (n-type) and the highly doped n-type cathode layer can be done in SiC.

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

DETAILED DESCRIPTION OF THE PREFERRED EMBODIMENTS

Figure 1:
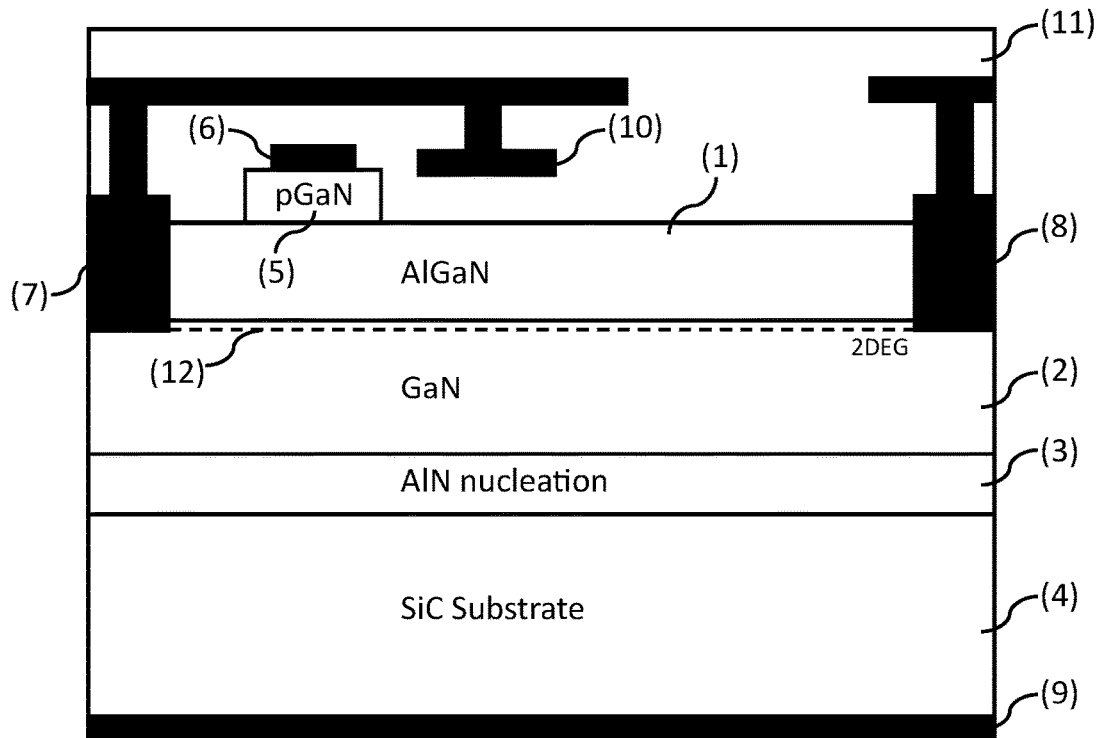
FIG. 1 depicts schematically a cross section of an AlGaN/GaN HEMT.

Like reference numerals are provided for corresponding features depicted in multiple figures.

FIG. 1 illustrates an example cross section of an AlGaN/GaN HEMT cross section. Various substrate materials can be used in place of SiC, such as Silicon and sapphire The substrate may be mono-crystalline and of any polytype (e.g. 4H—SiC, 6H—SiC, 3C—SiC).

The HEMT comprises an AlGaN/GaN heterojunction where a two-dimensional electron gas (2DEG) (12) is formed. The AlGaN/GaN heterojunction layers are grown epitaxially on the substrate (4). A nucleation layer (3) is present between the AlGaN/GaN heterojunction layers and the substrate. The device may comprise a substrate back metallisation contact (9). Due to the spontaneous and piezolelectric polarisation of GaN (and AlGaN, AlN), fixed charges are present at the interfaces between the different layers. The fixed charges attract mobile carriers which may form two dimensional gases of carriers of the opposite polarity of the fixed charge. In addition to the 2DEG (12) at the AlGaN/GaN interface, a 2DEG may also be present at the nucleation layer/substrate interface. A two-dimensional hole gas (2DHG) may be present at the GaN/nucleation layer interface. The relative strength (i.e. carrier concentration) of the two-dimensional gases may be affected by several parameters (mechanical stress as it determines the magnitude of piezopolarisation charges, interface traps, doping) and may vary significantly in devices. In some cases, the carrier concentration in the two-dimensional gases at the interface of the nucleation layer may be negligible.

The device in FIG. 1 further comprises a highly p-doped GaN region (5) which depletes the 2DEG under it at zero bias conditions, to create an enhancement mode transistor. A gate contact (6) is placed on the p-GaN region (5). In other examples, different gate technologies may be used.

The 2DEG (12) is contacted by a source contact (7) and a drain contact (8). In the example given in FIG. 1, the contacts to the 2DEG (12) are made by recessing the AlGaN layer (1).

The substrate may be connected to the source contact potential. This may be done at package level, printed circuit board (PCB) level, or device level. This is not illustrated in this example.

It is common in power HEMTs (and in power devices in general) to design field plate structures to shape the potential distribution during OFF-state bias conditions. A metal field plate structure (10) is illustrated as an example in FIG. 1. The device further comprises surface passivation of the semiconductor layers and additional intermetal dielectric layers. For clarity in the illustration, these layers are depicted as a single region 11.

Figure 2:
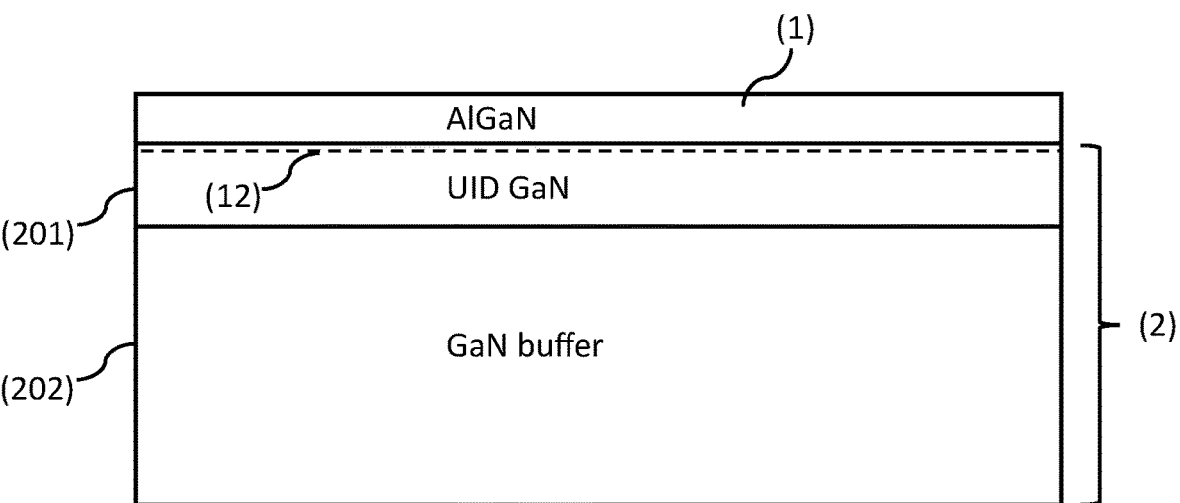
FIG. 2 depicts schematically a cross section of the GaN region.

FIG. 2 illustrates an example of a cross section of the GaN region (2) showing its sub-division into two further regions; a GaN buffer (202) and an unintentionally doped (UID) GaN region (201). The GaN buffer may be thicker (2-4 um for a 650V rated device) and substantially doped. The UID GaN region may have a thickness of 0.1-0.4 um. In embodiments of the invention illustrated in the figures below, the GaN buffer layer may be substantially thinner or not present at all.

Figure 3:
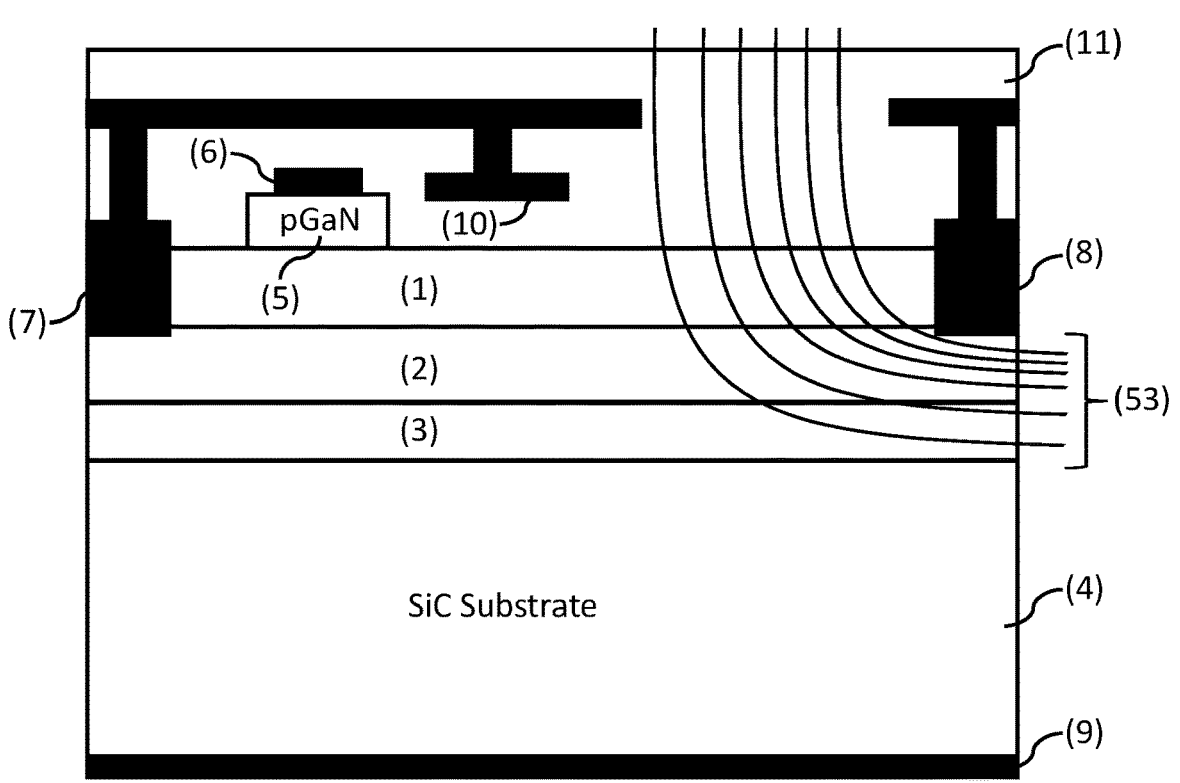
FIG. 3 depicts schematically an example potential distribution under off-state bias.

FIG. 3 illustrates an example of the potential distribution in a GaN HEMT such as that depicted in FIG. 1 under off-state bias. FIG. 3 depicts equipotential lines (53) in the structure, the equipotential lines (53) representing the potential distribution of the device. It will be understood that FIG. 3 is a schematic representation, and that therefore the equipotential lines represent an approximation of the potential distribution. If the substrate is both doped and connected to source potential, then the front end or surface of the substrate will be at near source potential under off-state bias. This will lead to the majority of the vertical potential drop to be present in the III-nitride epitaxial layers, and will therefore generally require a thicker GaN buffer layer to sustain the potential.

Figure 4:
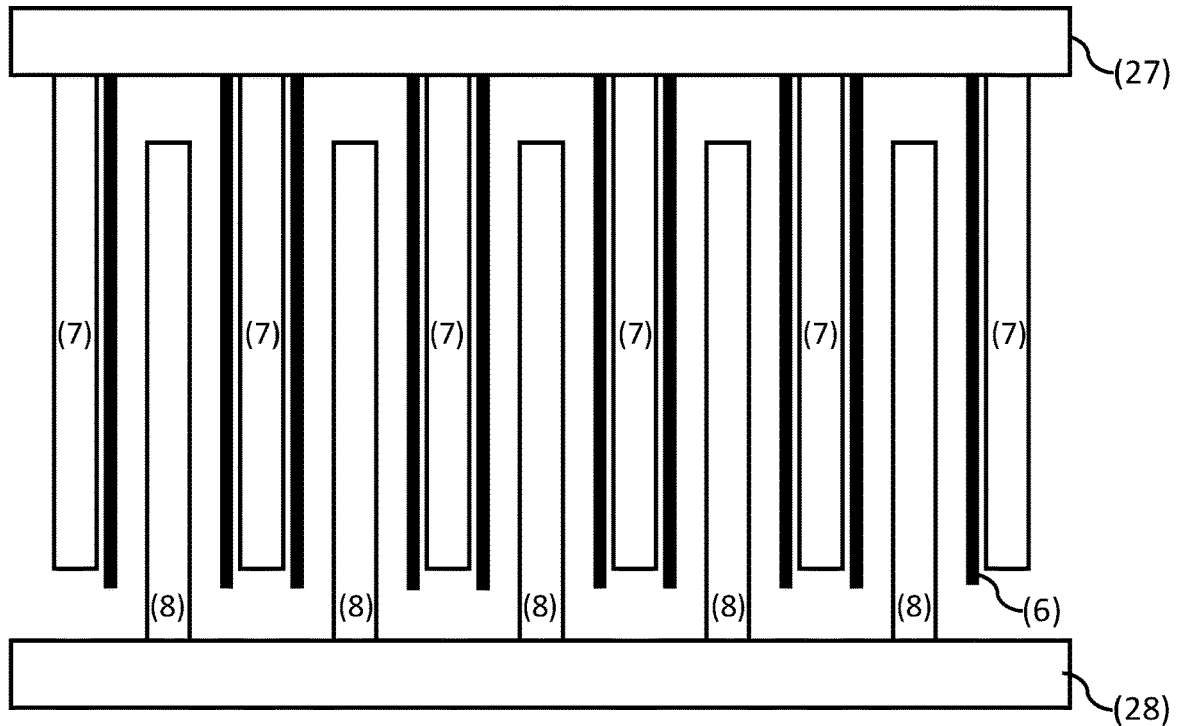
FIG. 4 depicts schematically a top view of the AlGaN/GaN HEMT of FIG. 1.

FIG. 4 illustrates a top view of an example layout of the device illustrated in FIG. 1. The layout of GaN HEMTs is often in an interdigitated configuration, that is it comprises of alternating fingers of source, gate and drain contacts.

Individual fingers may be connected with track metallisation such as source track metallisation (27) and drain track metallisation (28).

Figure 5:
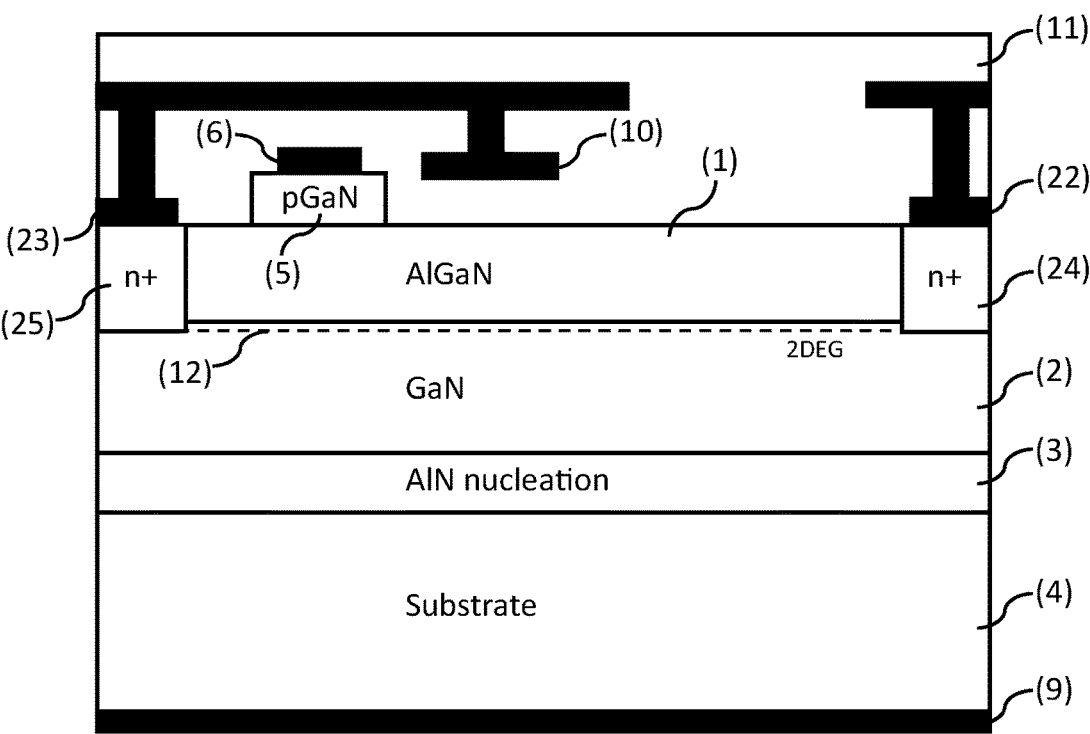
FIG. 5 depicts schematically a cross section of a second AlGaN/GaN HEMT.

FIG. 5 illustrates an additional example of a GaN HEMT where the source and drain contact to the 2DEG are formed in an alternative manner. Rather than recessing the AlGaN layer as in FIG. 1, highly n-doped regions are formed, region (25) for the source contact (23), and region (24) for the drain contact (22). In the following examples, one of these approaches to making a contact will be illustrated for simplicity. However, it will be understood that the embodiments presented in the following examples are not limited to the depicted contact formation, and instead the contact formation methods depicted in FIGS. 1 and 5 could both be used, along with other suitable approaches known in the art.

Figure 6:
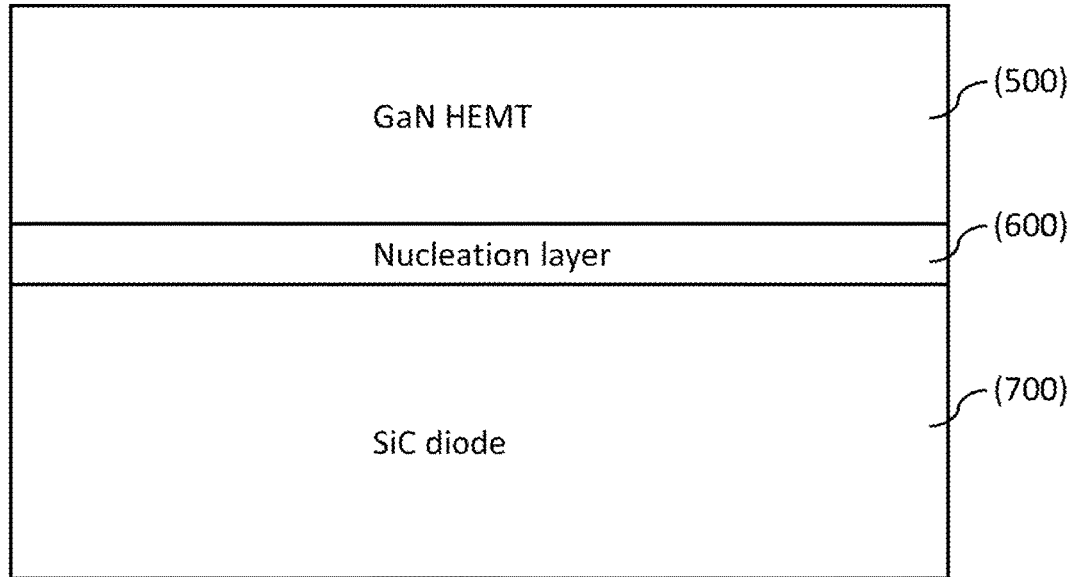
FIG. 6 depicts schematically a GaN region according to embodiments of the present disclosure.

FIG. 6 illustrates an embodiment according to the present disclosure which comprises a GaN HEMT region (500) and a SiC diode region (700). A nucleation layer, which is required to grow epitaxial III-nitride layers on a SiC substrate, is also illustrated (600). At least one section of the SiC diode region is directly below the GaN HEMT region, as illustrated.

Figure 7:
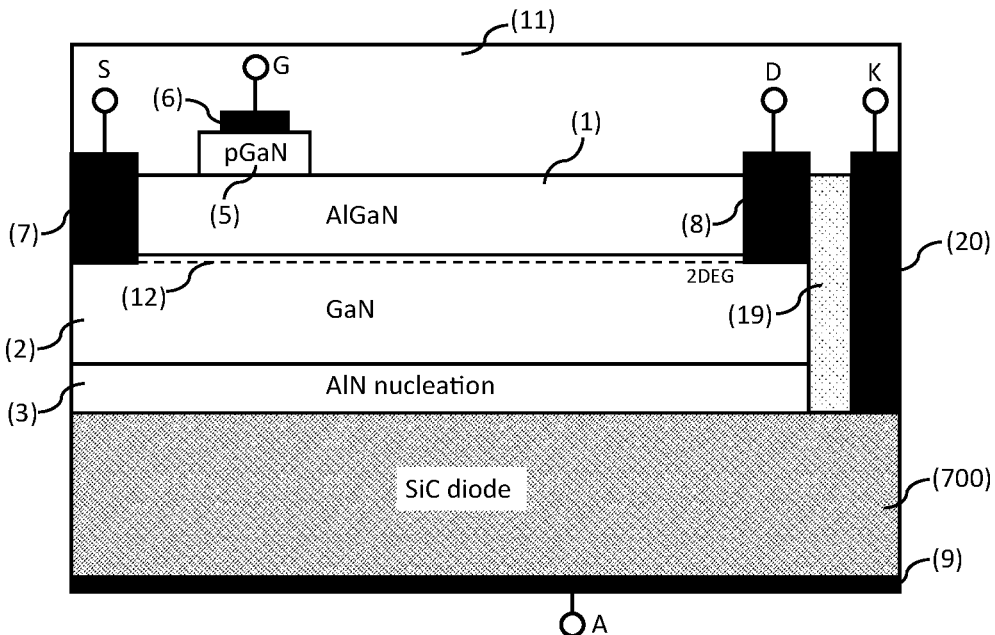
FIG. 7 depicts schematically a GaN HEMT according to embodiments of the present disclosure.

FIG. 7 illustrates a schematic of an additional embodiment according to the present disclosure. In this schematic, the GaN HEMT is illustrated in more detail than in FIG. 6, and comprises the AlGaN (1)/GaN (2) heterojunction, the 2DEG (12), a pGaN region (5), a gate contact (6), a source contact (7) and a drain contact (8). The GaN HEMT has three terminals source(S), gate (G) and drain (D). The SiC diode is illustrated as having two terminals, a cathode (K) and an anode (A). The anode may be a back metallisation layer (9). The cathode may be a contact (20) on the frontend of the wafer. An isolation or dielectric layer (19) may be present between the cathode and the GaN HEMT.

Figure 8:
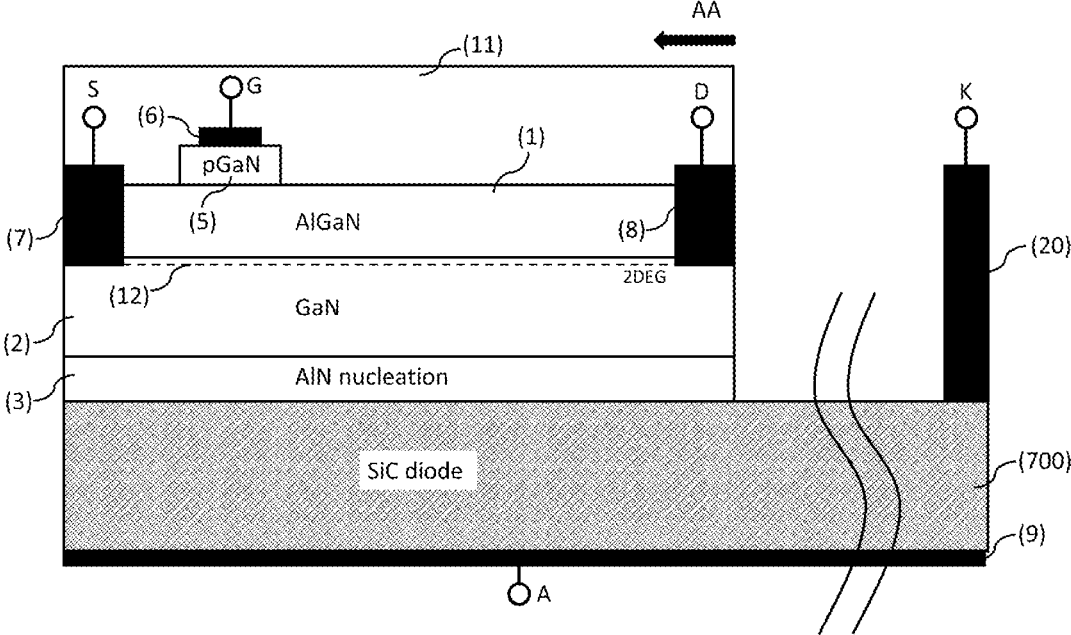
FIG. 8 depicts schematically a GaN HEMT according to further embodiments of the present disclosure.

FIG. 8 illustrates a schematic of a further embodiment similar to FIG. 7. This embodiment illustrates that one of the contacts of the SiC diode may be placed a distance from the active area (AA) of the GaN HEMT, e.g. separated by a distance such that it is not a part of alternating pattern of fingers of a GaN HEMT in an interdigitated device layout. A section of the SiC diode (700) may still be directly below the GaN HEMT.

Figure 9:
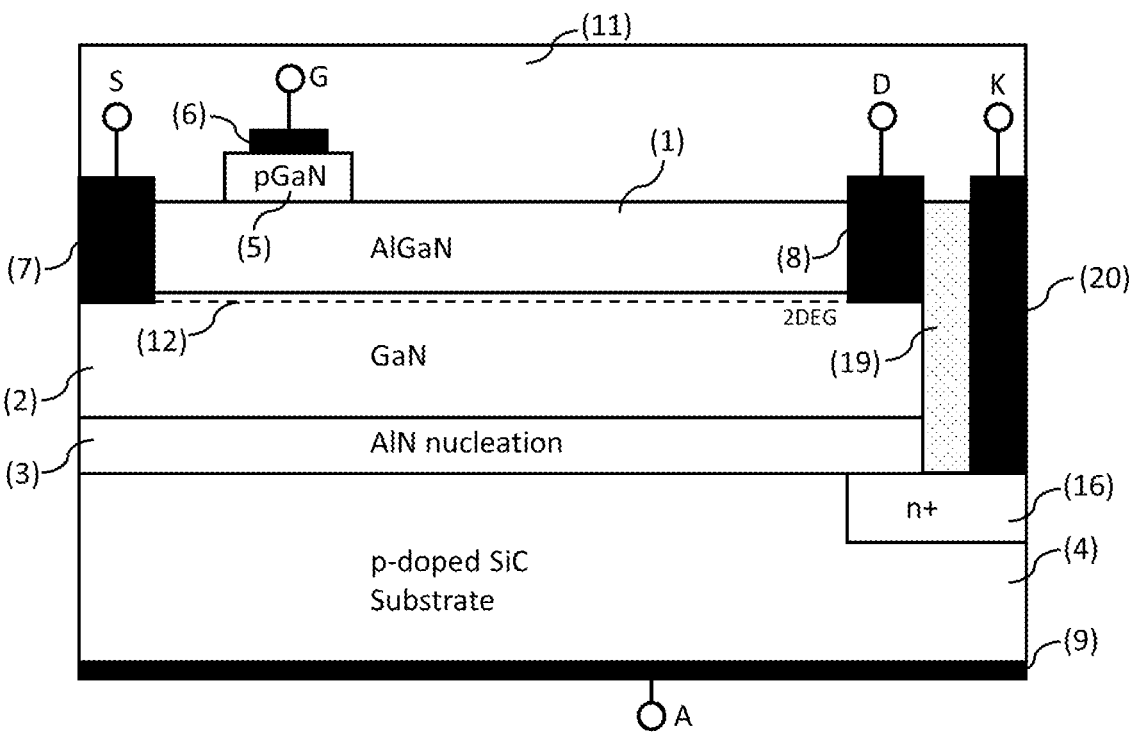
FIG. 9 depicts schematically a GaN HEMT according to further embodiments of the present disclosure.

FIG. 9 illustrates a further embodiment according to the present disclosure. This embodiment comprises a GaN HEMT as presented in previous figures. The field plate structure is not illustrated for simplicity. The GaN HEMT is a three-terminal device with a source(S), gate (G) and drain (D) terminal. The structure illustrated in FIG. 9 comprises an additional diode in the SiC substrate. The SiC diode is a two-terminal device with a cathode (K) and an anode (A). In this embodiment, the SiC diode is a p-n diode formed between a heavily doped n+ cathode layer (16) and a p-doped SiC substrate (4). The cathode (K) is formed using a metal contact (20) and the anode (A) is formed by back metallisation (9) of the substrate.

Several examples of suitable SiC diodes are described below. In some examples, the drain terminal and the cathode terminal may be connected through metallisation or may be a common terminal.

The source terminal and the anode terminal may be connected at device level, package level, or at PCB level, or may be a common terminal.

Figure 10:
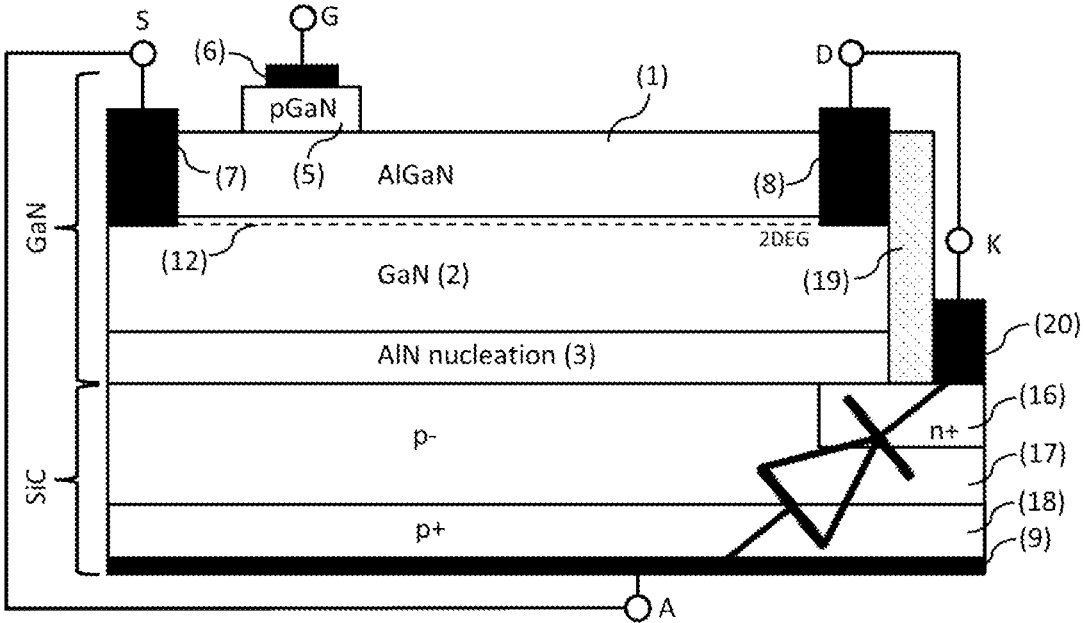
FIG. 10 depicts schematically a GaN HEMT according to further embodiments of the present disclosure.

FIG. 10 illustrates a schematic example of an additional embodiment. The SiC diode in this embodiment is a p+/p–/n+ diode with a p-drift region (17), an n+ cathode layer (16) and a p+ anode layer (18). The GaN HEMT drain terminal (D) and the SiC diode cathode terminal (K) are connected in this example. The GaN HEMT source terminal(S) and the SiC diode anode terminal (A) are also connected in this example.

Figure 11:
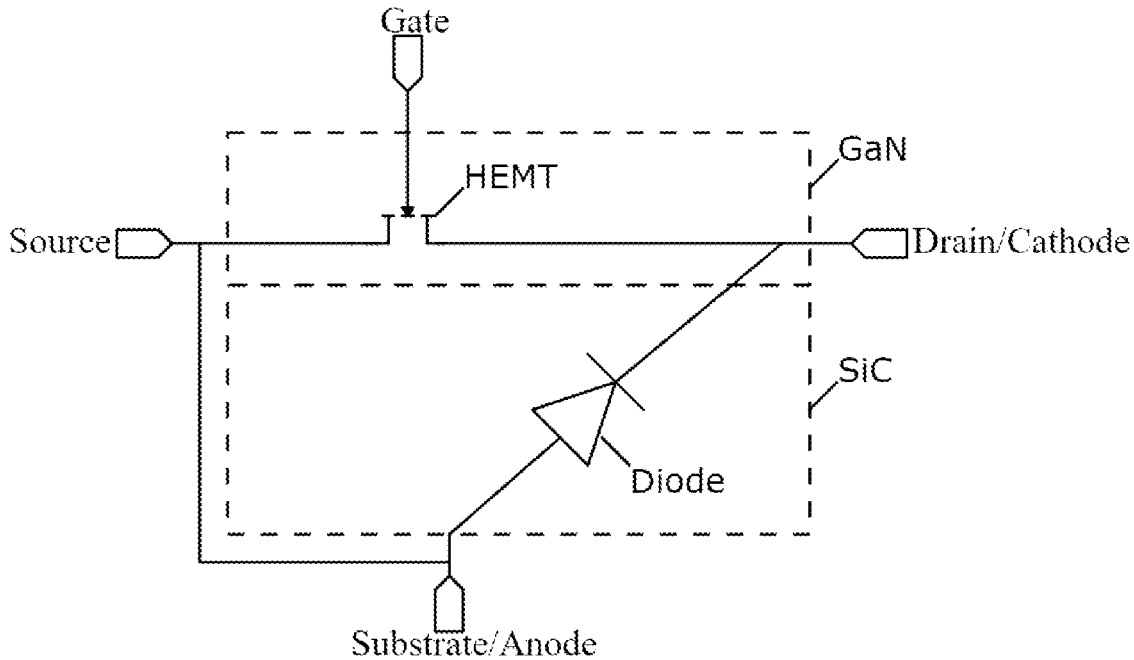
FIG. 11 depicts a circuit schematic of the GaN HEMT depicted in FIG. 10.

FIG. 11 illustrates a circuit schematic of some of the examples illustrated for example in FIG. 10. The schematic comprises a GaN HEMT and a SiC diode. The GaN HEMT drain terminal (D) and the SiC diode cathode terminal (K) are connected in this example. This connection may be done on chip, for example through metallisation. Alternatively, the drain and cathode terminal may be a common contact as illustrated in in FIG. 17. The GaN HEMT source terminal(S) and the SiC diode anode terminal (A) are also connected in this example. This connection may be done off chip, for example at package level or PCB level.

Figure 12:
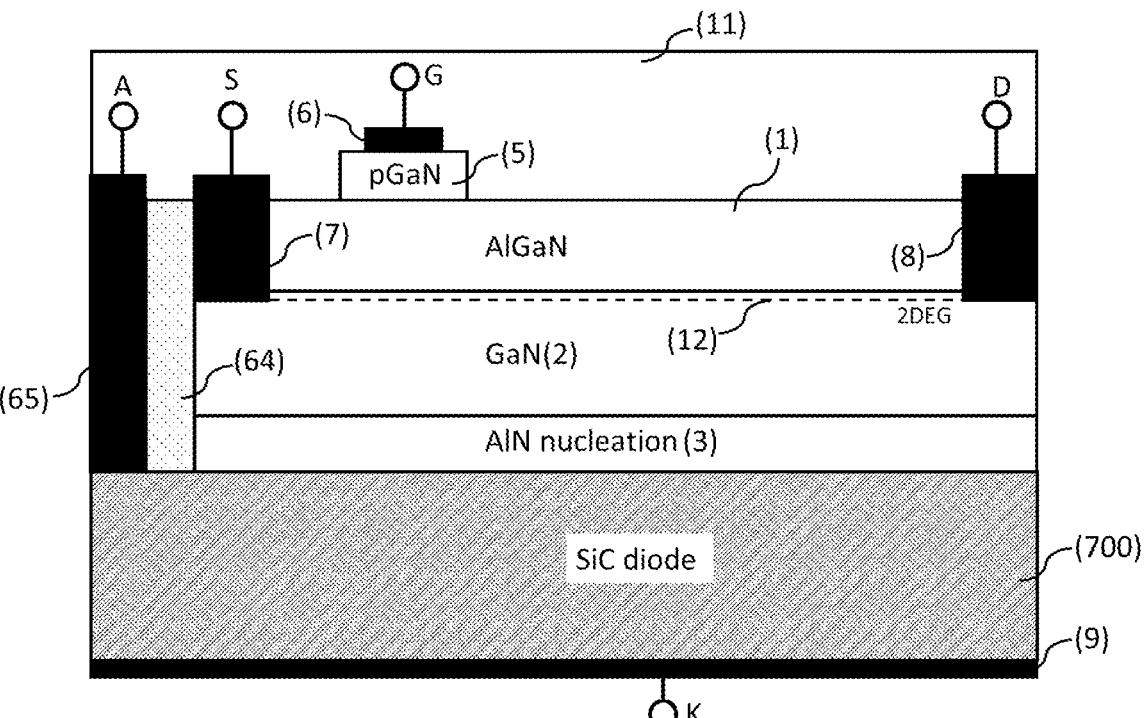
FIG. 12 depicts schematically a GaN HEMT according to further embodiments of the present disclosure.

FIG. 12 illustrates an additional embodiment. This embodiment comprises a GaN HEMT and a SiC diode as in previous embodiments. However, in this embodiment, the cathode (K) of the SiC diode is the backside metallisation contact of the SiC substrate. The anode of the SiC diode is placed on the frontend of the SiC substrate as contact (65). In this example, the anode of the SiC diode is separated from the GaN HEMT, and more specifically from the source contact (7), by an isolation or dielectric region (64).

Figure 13:
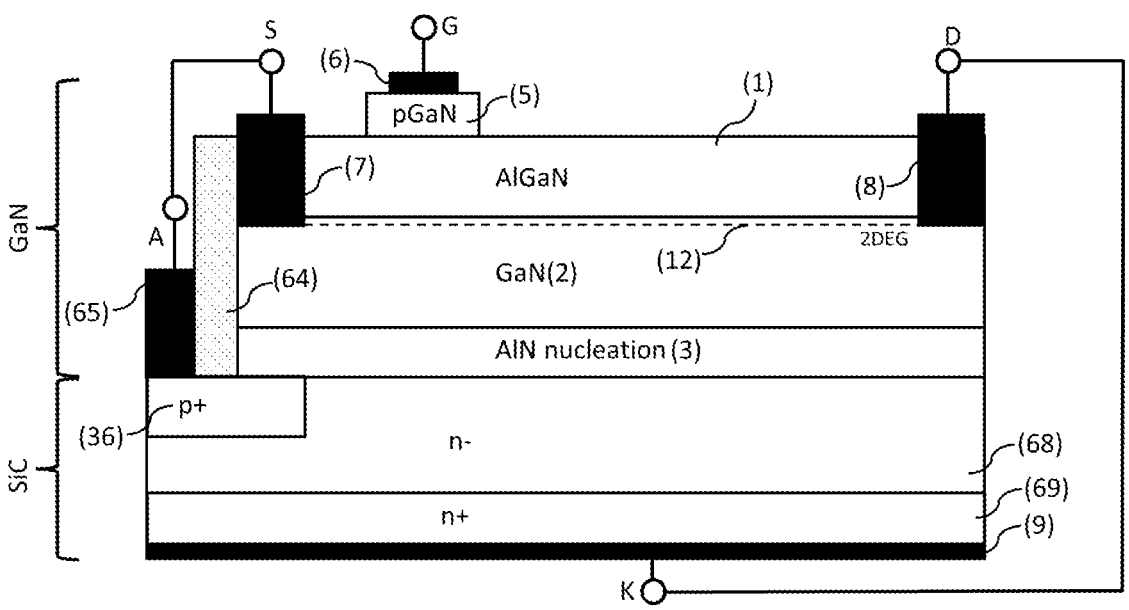
FIG. 13 depicts schematically a GaN HEMT according to further embodiments of the present disclosure.

FIG. 13 illustrates a schematic example of an additional embodiment. The SiC diode in this embodiment is a p+/n–/n+ diode with a n-drift region (68), an n+ cathode layer (69) and a p+ anode layer (36). The cathode terminal may comprise a back metallization contact. This is particularly the case if a highly doped n+ substrate (second conductivity type) is used, or a layer of n+ is implanted on the backside of the substrate. The GaN HEMT drain terminal (D) and the SiC diode cathode terminal (K) are connected in this example. The GaN HEMT source terminal(S) and the SiC diode anode terminal (A) are also connected in this example.

Figure 14:
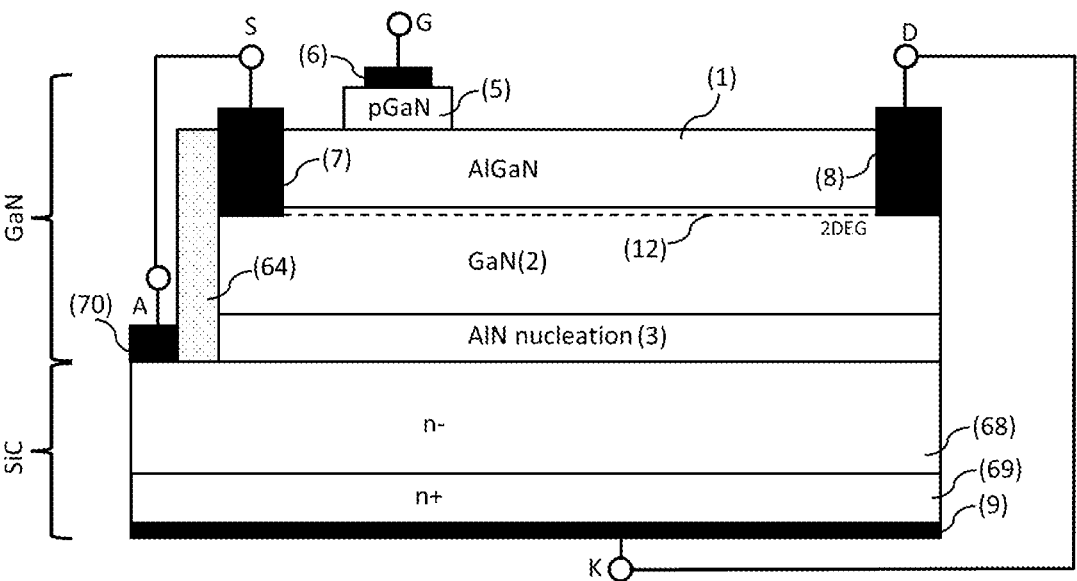
FIG. 14 depicts schematically a GaN HEMT according to further embodiments of the present disclosure.

FIG. 14 illustrates a schematic example of an additional embodiment. The SiC diode in this embodiment is a Schottky diode with a Schottky anode contact (70), an n-drift region (68) and an n+ cathode layer (69). The GaN HEMT drain terminal (D) and the SiC diode cathode terminal (K) are connected in this example. The GaN HEMT source terminal(S) and the SiC diode anode terminal (A) are also connected in this example.

Figure 15:
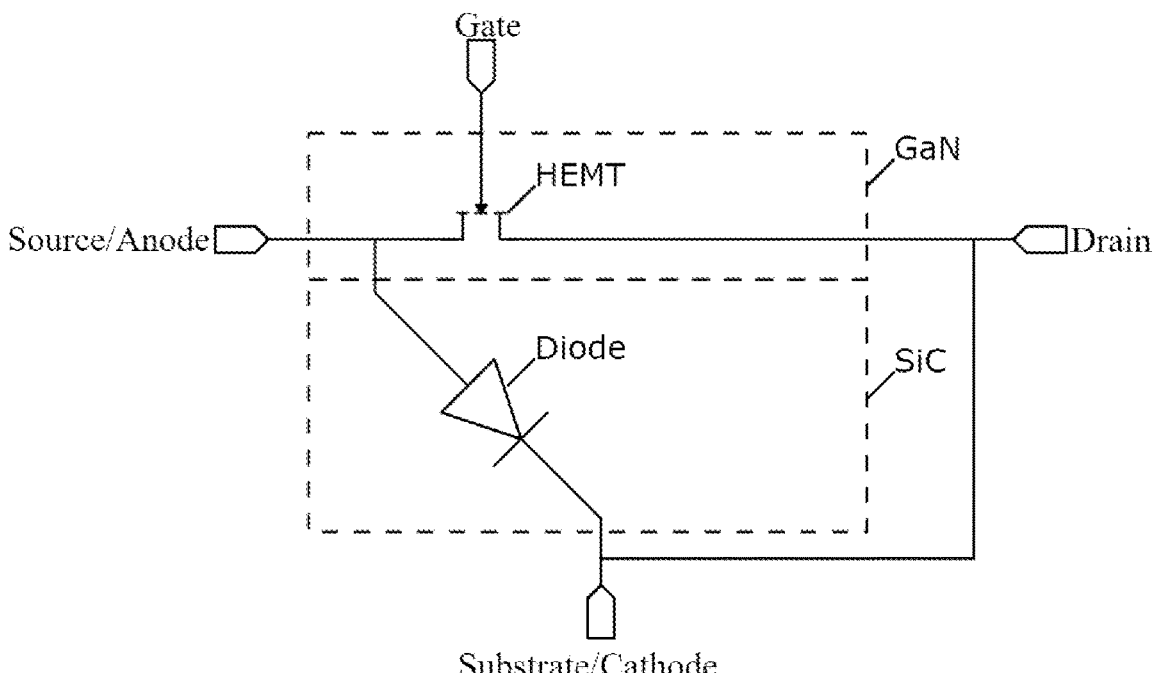
FIG. 15 depicts a circuit schematic of the GaN HEMT depicted in FIG. 13.

FIG. 15 illustrates a circuit schematic corresponding to the power device depicted in FIG. 13. The schematic comprises a GaN HEMT and a SiC diode. The GaN HEMT drain terminal (D) and the SiC diode cathode terminal (K) are connected in this example.

This connection may be done on chip, for example through metallisation. Alternatively, the drain and cathode terminal may be a common contact. The GaN HEMT source terminal(S) and the SiC diode anode terminal (A) are also connected in this example. This connection may be done off chip, for example at package level or PCB level.

Figure 16:
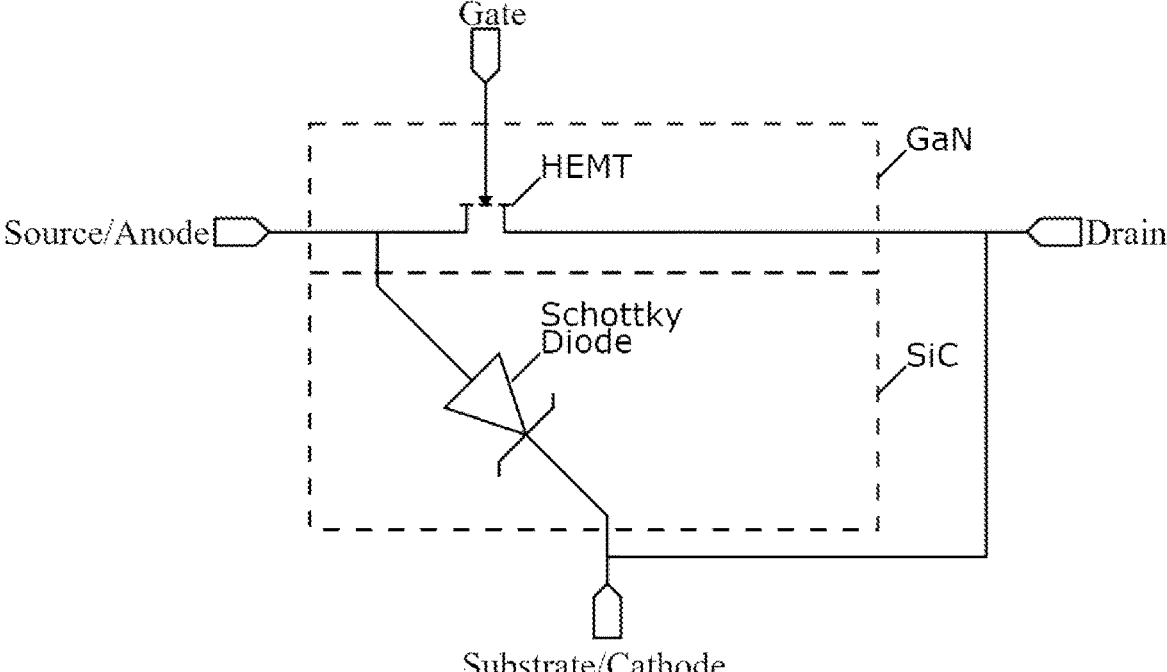
FIG. 16 depicts a circuit schematic of the GaN HEMT depicted in FIG. 14.

FIG. 16 illustrates a circuit schematic similar to FIG. 15. In FIG. 16, the SiC diode is a Schottky diode as illustrated for example in FIG. 14.

Figure 17:
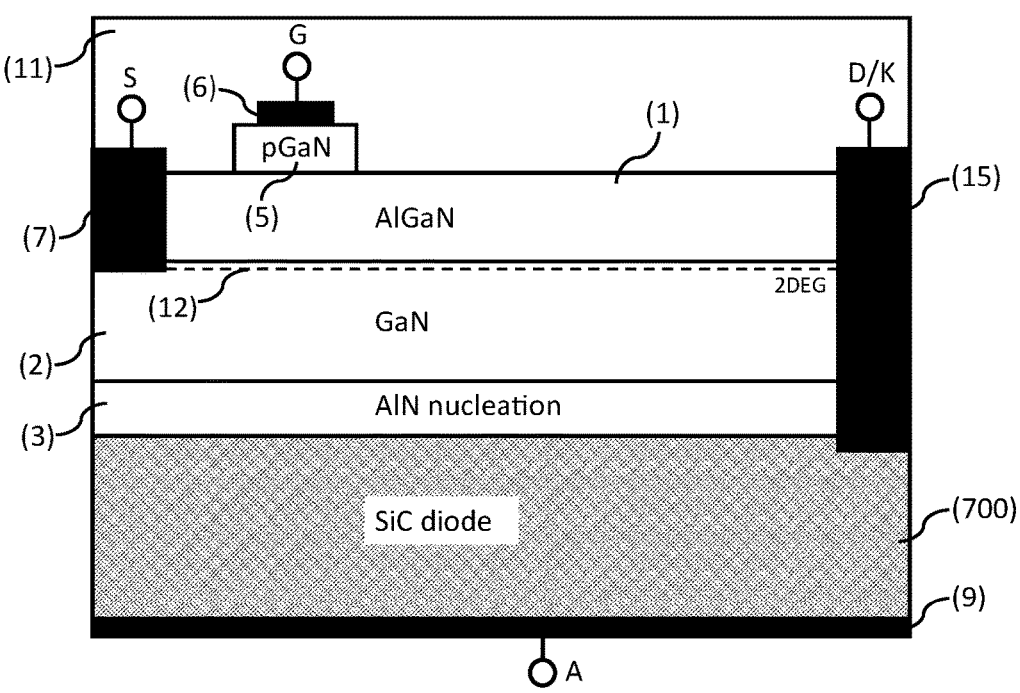
FIG. 17 depicts schematically a GaN HEMT according to further embodiments of the present disclosure.

FIG. 17 illustrates an additional embodiment similar to FIG. 7. However, in FIG. 17 the drain contact (15) of the GaN HEMT also forms the cathode contact of the SiC diode.

Figure 18:
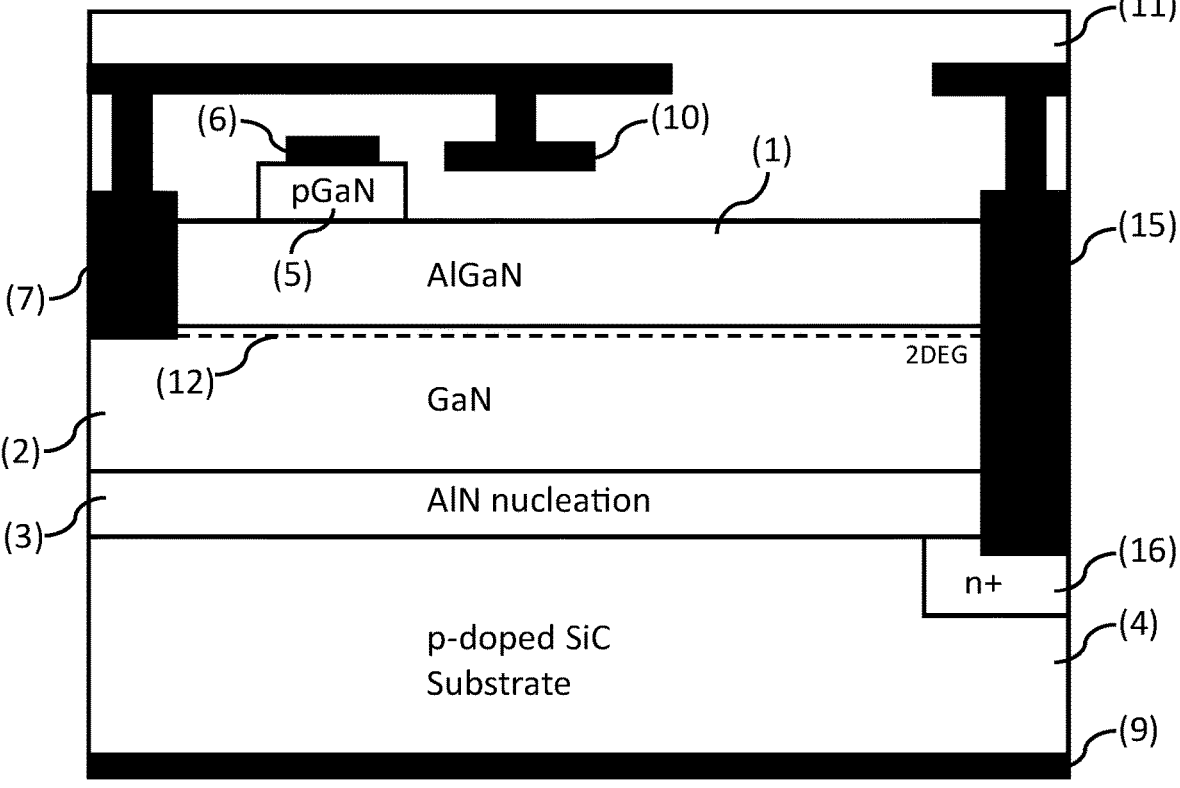
FIG. 18 depicts schematically a GaN HEMT according to further embodiments of the present disclosure.

FIG. 18 illustrates a further embodiment according to the present disclosure. In this embodiment, the substrate is a p-doped SiC substrate (4). It may comprise an n+ cathode layer (16) which is connected to the drain terminal (15). In one example, the n+ cathode layer region (16) in the SiC substrate may be formed through implantation of dopants.

In this embodiment a p-n junction is therefore formed in the substrate where the n+ cathode layer region (16) is connected to the drain terminal and the p-doped substrate is connected to the source potential. The p-n diode formed in the SiC substrate is therefore in reverse bias when the GaN HEMT is in the off-state. The p-n diode is in forward bias when the GaN HEMT is in the third quadrant mode of operation; in other words, when the drain terminal potential is lower than the source terminal potential. In this embodiment the contact (15) may therefore be considered the cathode of the SiC diode and the substrate contact (9) may be considered the anode of the SiC diode.

The p-n diode in the SiC substrate may offer advantages to the operation of the device. During off-state operation, a more favourable potential distribution may limit the electric field in the device at a given voltage rating. The device may be designed such that the majority of the vertical potential drop is in the SiC substrate region. This can therefore allow the GaN region (2) to have a reduced thickness for a device of the same voltage rating compared to existing devices. Furthermore, a more effective potential distribution may enable the reduction in the drift region distance of the GaN HEMT i.e. the separation between the gate and drain terminal for a device with the same voltage rating. This can lead to a device with a more competitive specific Rds(on).

The p-n diode may additionally give the device avalanche capability, limiting the maximum voltage which can develop across the device drain to source terminals.

Figure 19:
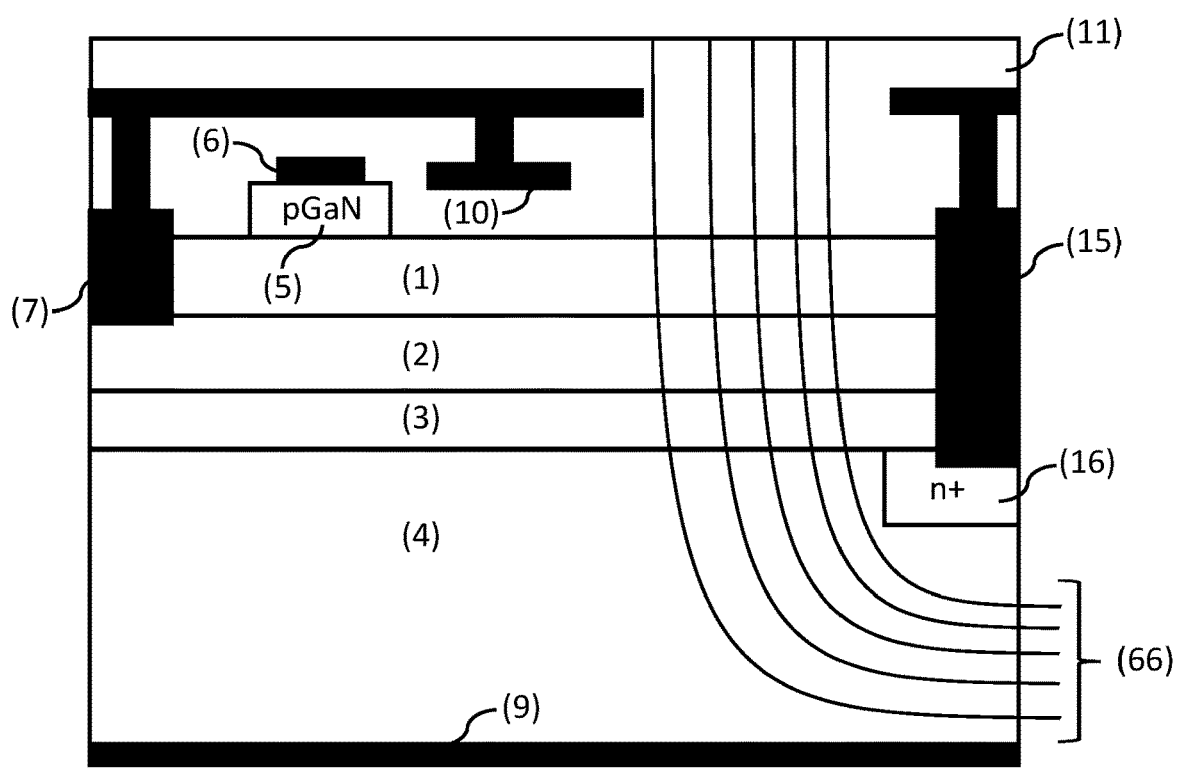
FIG. 19 depicts schematically an example potential distribution of a GaN HEMT according to the present disclosure under off-state bias.

FIG. 19 depicts equipotential lines (66) of the device of FIG. 18 under off-state bias. As with FIG. 3, it will be understood that FIG. 19 is a schematic representation, and as such the equipotential lines (66) representing the potential distribution of the device are an approximation.

Figure 20:
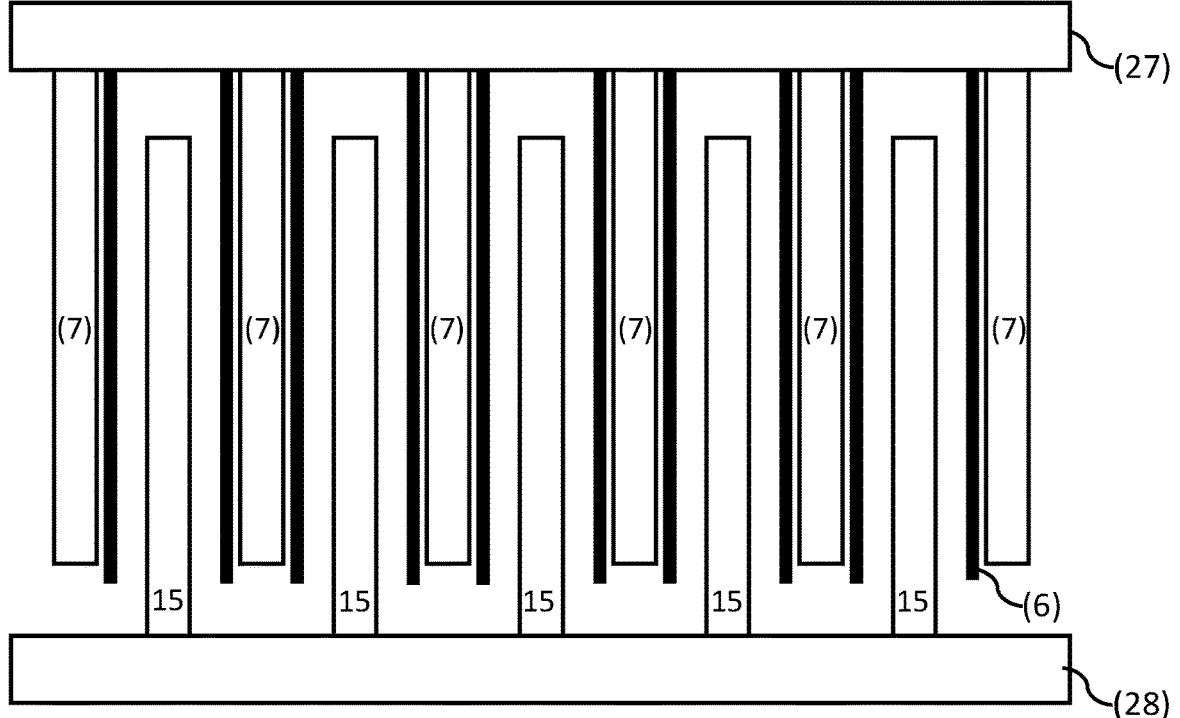
FIG. 20 depicts schematically a top view of the AlGaN/GaN HEMT of FIG. 18.

FIG. 20 illustrates an example of a layout top view of the device in illustrated in FIG. 18, comprising an interdigitated layout.

Figure 21:
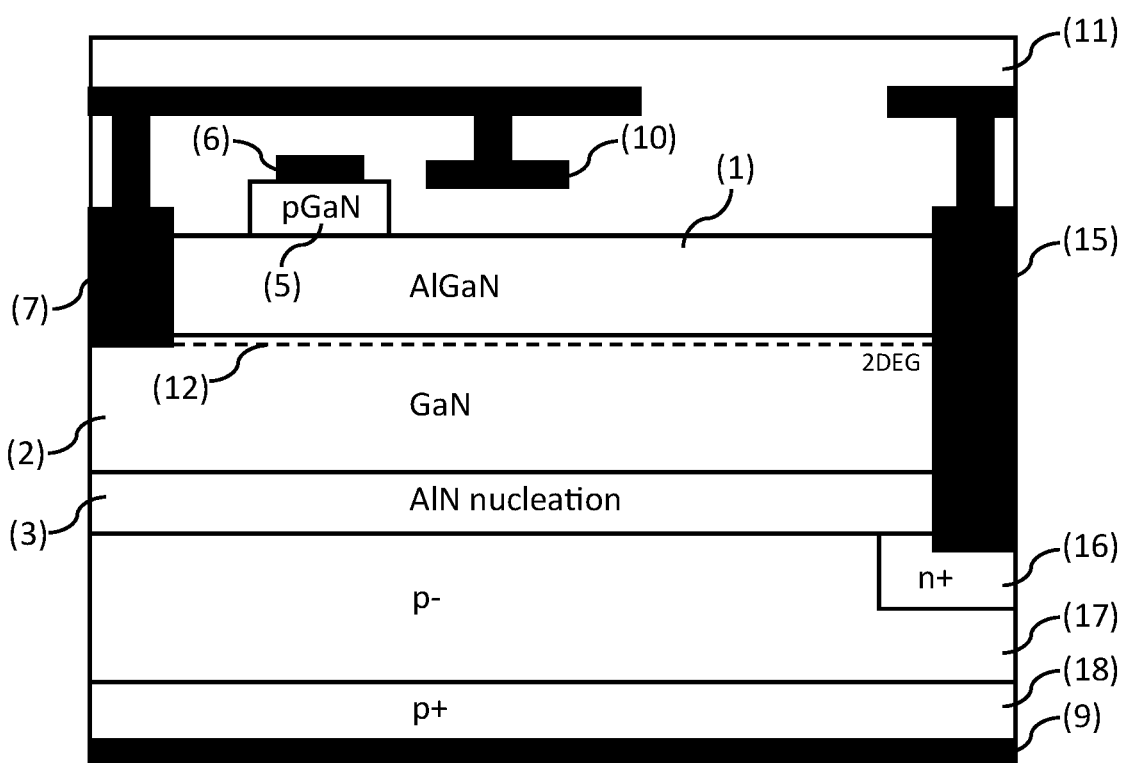
FIG. 21 depicts schematically a GaN HEMT according to further embodiments of the present disclosure.

FIG. 21 illustrates an additional embodiment according to the present disclosure. This embodiment is similar to the embodiment illustrated in FIG. 18 with differences in the doping of the SiC substrate. This embodiment may be particularly suitable for the formation of a high voltage diode compared to the embodiment illustrated in FIG. 18. Rather than forming a p-n junction in the SiC substrate, a p+/p–/n+ junction is formed. That may refer to a region of the SiC substrate being at a lower doping, therefore forming a p-drift region (17) and a p+ anode layer (18) in the substrate. The SiC high voltage diode drift region is in physical contact with the III-nitride layer above. This embodiment may offer a more favourable potential distribution during reverse bias in the SiC diode than the embodiment in FIG. 18.

Figure 22:
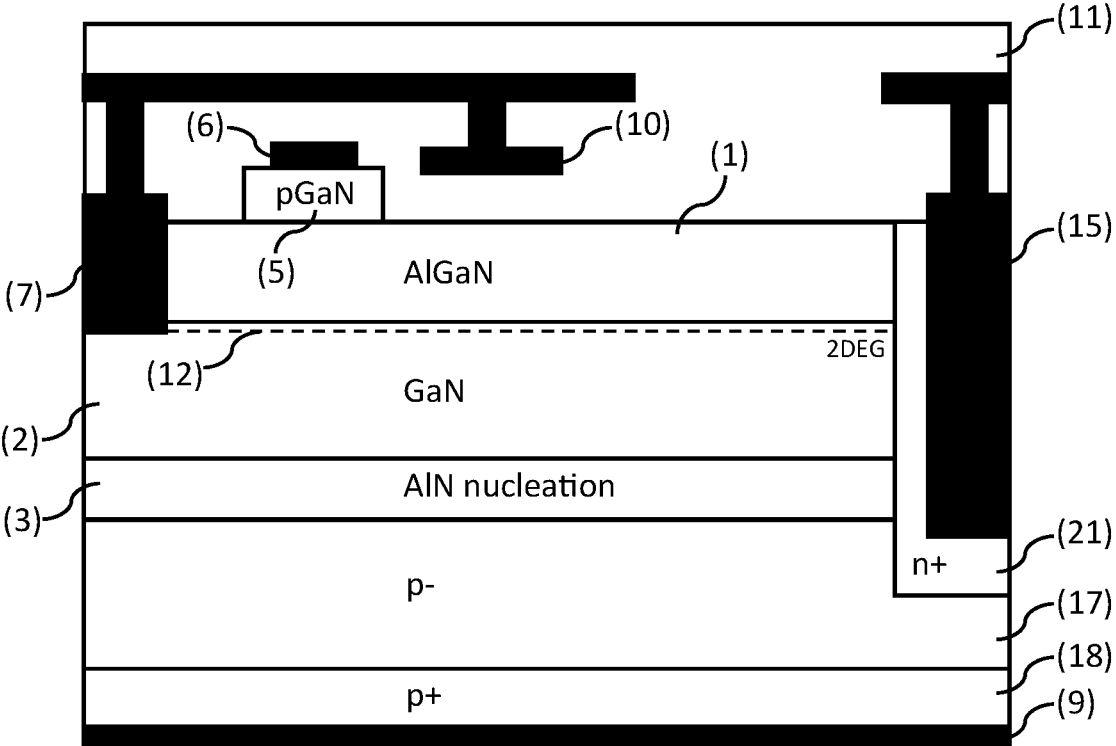
FIG. 22 depicts schematically a GaN HEMT according to further embodiments of the present disclosure.

FIG. 22 illustrates an additional embodiment according to the present disclosure. FIG. 22 is similar to the embodiment of FIG. 21, but the n+ cathode layer region, previously formed in the SiC substrate, is now also formed in the III-nitride epitaxial layers. n+ region (21) can lead to a more favourable potential distribution in the structure, depending on the strength of the interface two dimensional gases and the doping in the III-nitride layers (1-3).

Figure 23:
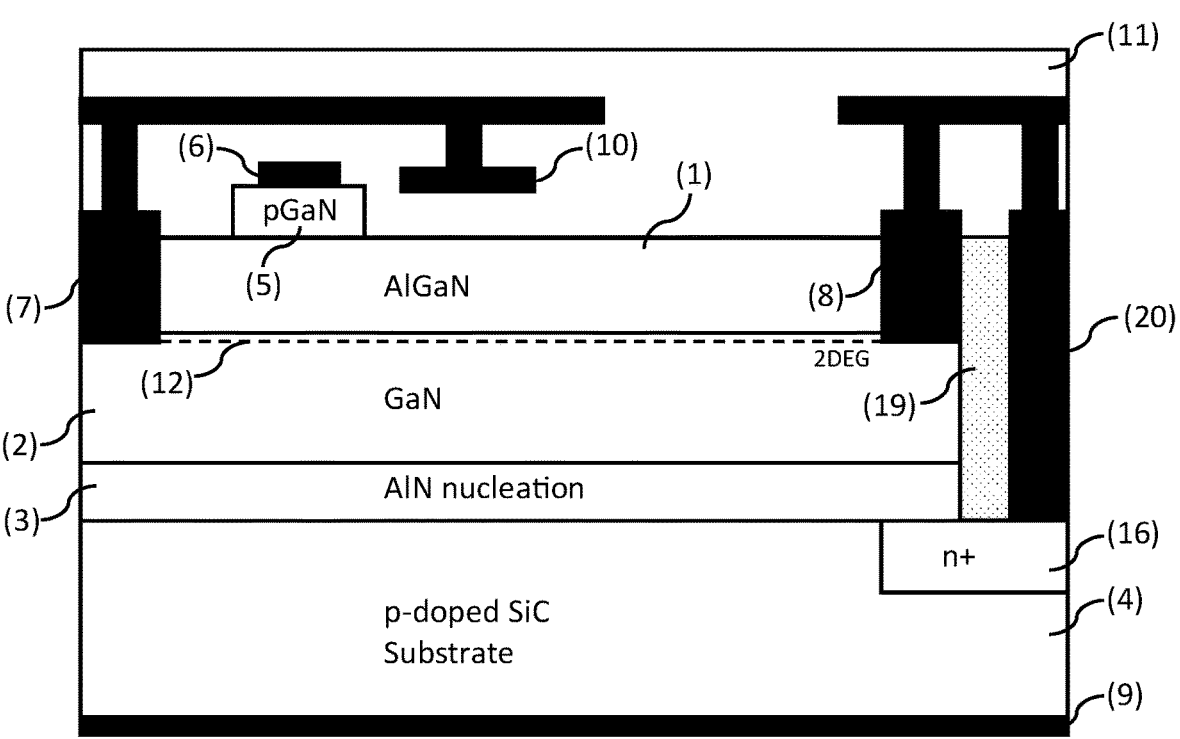
FIG. 23 depicts schematically a GaN HEMT according to further embodiments of the present disclosure.

FIG. 23 illustrates an additional embodiment according to the present disclosure. This embodiment is similar to the embodiment of FIG. 18. However, in this embodiment an isolation region (19) is formed in the structure. The isolation region may be a dielectric layer. The n+ cathode layer (16) in the SiC substrate is connected to the drain terminal through an additional contact, which is made only to the n+ region and not to the III-nitride layers. The drain contact (8) and the additional contact may be connected through track metallisation.

In this embodiment, the additional contact may be considered as a cathode contact (20) of the SiC diode, while the substrate back-metallisation contact (9) may be considered as the anode of the diode.

Figure 24:
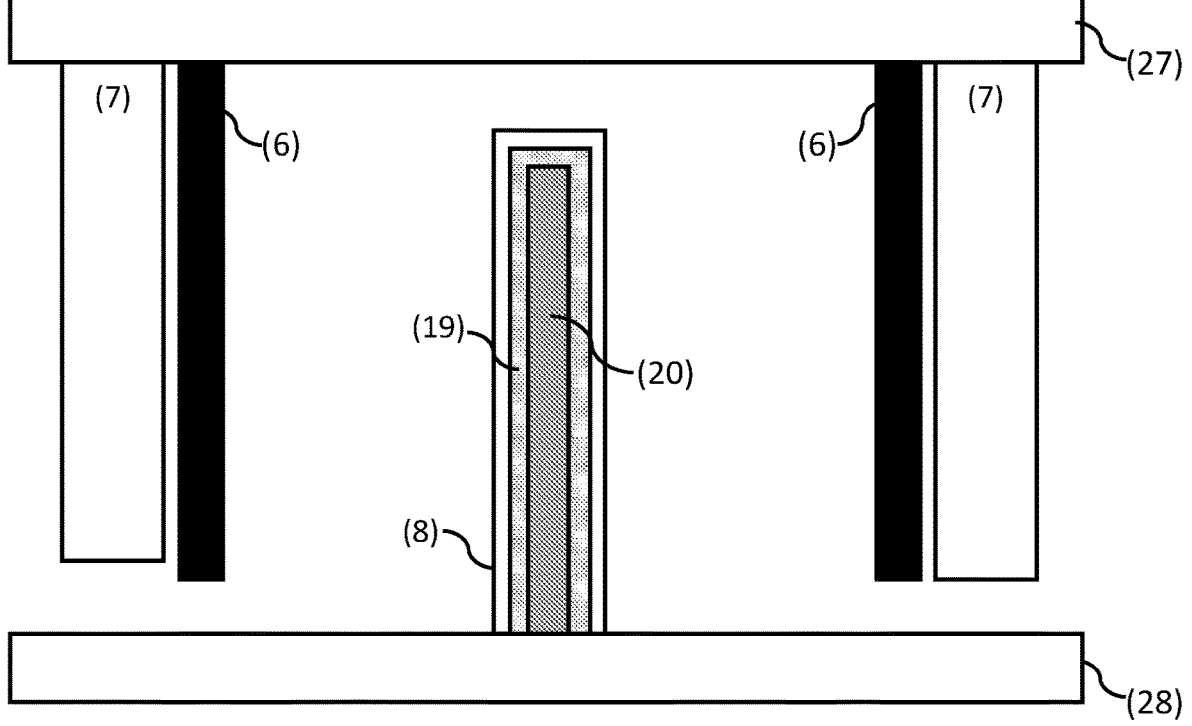
FIG. 24 depicts schematically a top view of the AlGaN/GaN HEMT of FIG. 23.

FIG. 24 an example of a layout top view of the device in illustrated in FIG. 23. Only one repeating cell of a possible interdigitated layout is illustrated for simplicity. However, it will be understood that further cells may be provided. For example, source contacts (7) may be shared between neighbouring cells.

Figure 25:
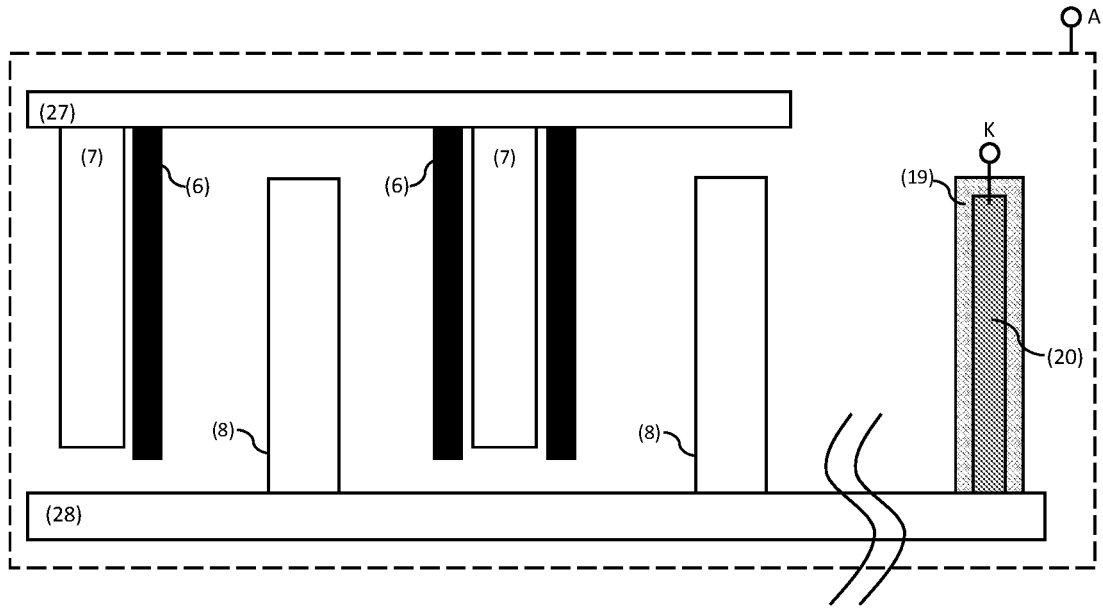
FIG. 25 depicts schematically a second top view of the AlGaN/GaN HEMT of FIG. 23.

FIG. 25 illustrates an alternative example of a layout top view of the device illustrated in FIG. 23. In FIG. 24, each finger in the interdigitated layout comprises an n+ cathode layer (16), isolation region (19) a cathode contact (20). FIG. 25, illustrates an example where a minimum of one location in the device has these features. This may be at the edge of the device. The one location may be sufficient due to the potential presence of the 2DEG at the AlN/SiC interface, which is connected to the drain potential via n+ cathode layer (16) and additional contact (20).

In the following figures, only the regions in the SiC will be shown in detail for simplification in order to illustrate different implementations of a diode, with the GaN HEMT illustrated as a single block. However, it will be understood that each of the example GaN HEMTs described above may be combined with each of the substrate discussed below, in place of the GaN HEMT block.

Figure 26:
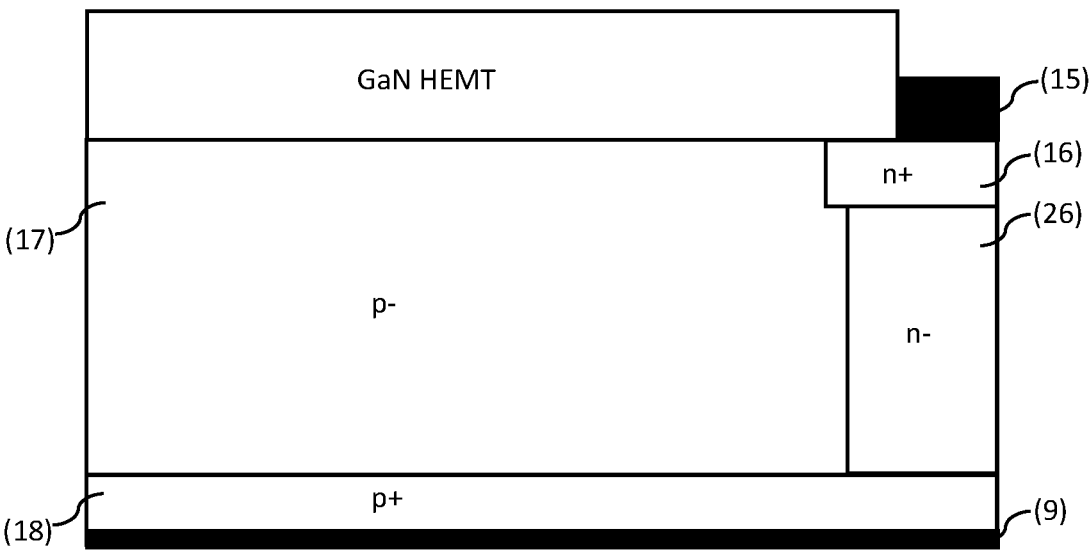
FIG. 26 depicts schematically a superjunction formed in a substrate according to embodiments of the present disclosure.
Figure 27:
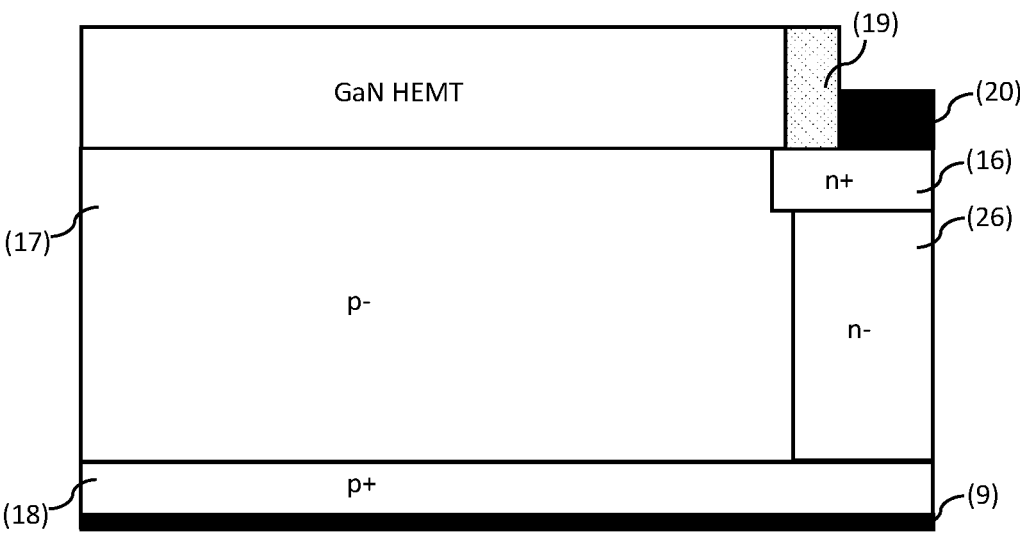
FIG. 27 depicts schematically a superjunction formed in a substrate according to further embodiments of the present disclosure.

The cathode contact of the diode in the following examples may be implemented in any of the ways illustrated thus far, and are not limited to the specific contact implementation depicted in the embodiment. Example contacts (15), (20) with and without an isolation layer (19) are shown in FIG. 26 and FIG. 27. Alternatively, the contact may be spatially separated from the GaN HEMT, for example as shown in e.g. FIGS. 8 and 28.

In FIG. 26, the junction formed in the SiC substrate is a Superjunction. This is achieved by incorporating an n-doped pillar (26) in the drift region of the p+/p–/n+ junction illustrated in previous examples.

FIG. 27 illustrates an additional embodiment similar to embodiment in FIG. 26, but with an alternative implementation of the cathode contact (20), corresponding to that illustrated in previous some examples such as FIG. 23.

Figure 28:
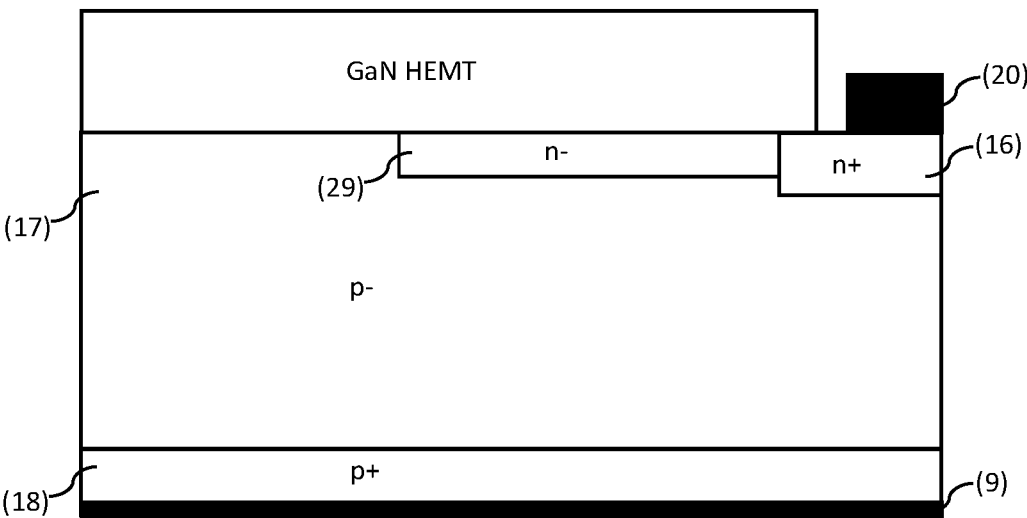
FIG. 28 depicts schematically a junction formed in a substrate according to further embodiments of the present disclosure.

FIG. 28 illustrates an additional embodiment similar to the embodiment in FIG. 21. In this embodiment, the SiC diode comprises an additional n-region (29). This region may be included to achieve an improved potential distribution in the structure when the diode is in reverse bias. The n-region may reduce the electric field peak at the edge of the n+ cathode layer (16) at a given voltage bias.

Figure 29:
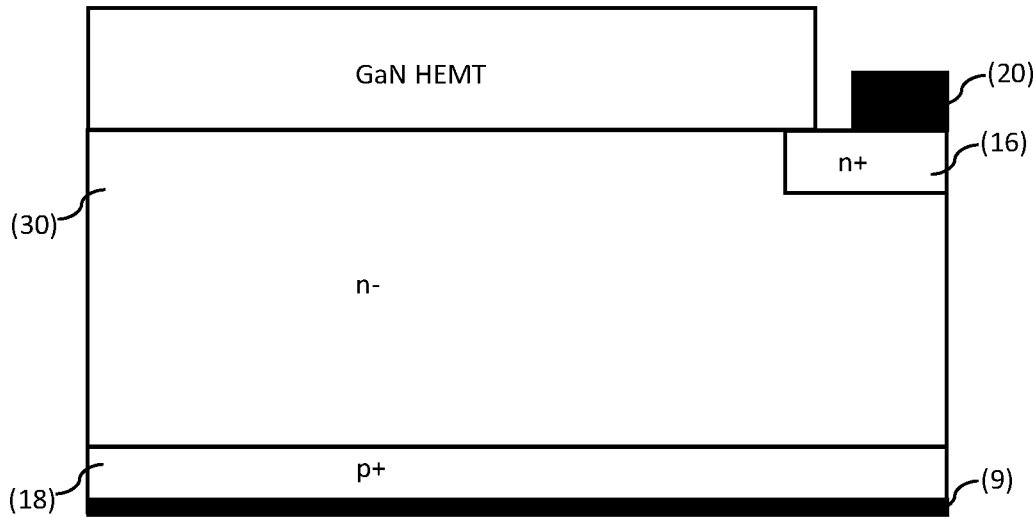
FIG. 29 depicts schematically a junction formed in a substrate according to further embodiments of the present disclosure.

FIG. 29 illustrates an additional embodiment similar to FIG. 21. However, in this embodiment the drift region in the power SiC diode is an n-region (30) rather than p-region.

Figure 30:
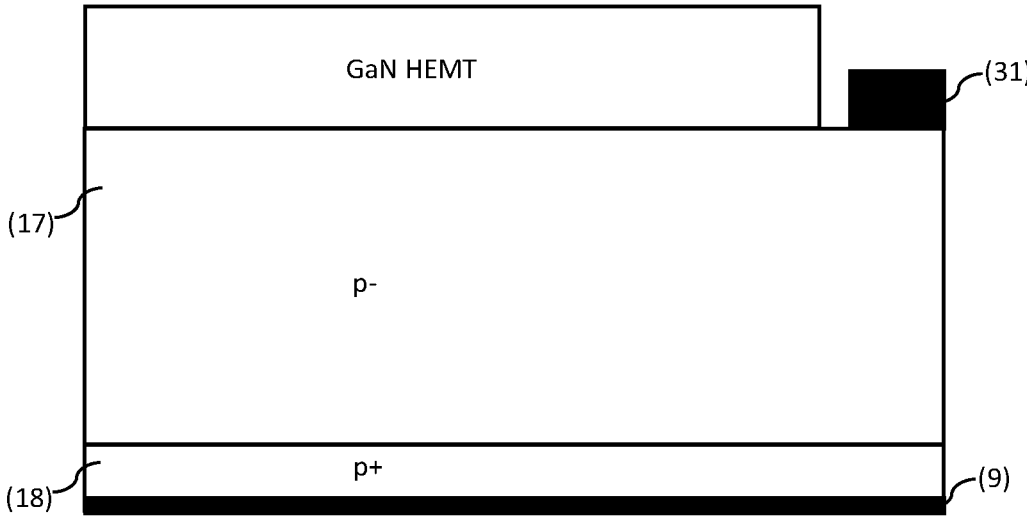
FIG. 30 depicts schematically a substrate with a Schottky contact according to embodiments of the present disclosure.

FIG. 30 illustrates an additional embodiment of the SiC diode which comprises a Schottky contact (31), a p-drift region (17) and a p+ anode layer (18). In this embodiment, the diode is a Schottky diode rather than a p-n junction diode. The Schottky terminal may be based on an energy (voltage) barrier formed between a metal (with a specific work function) and a semiconductor substrate.

Figure 31:
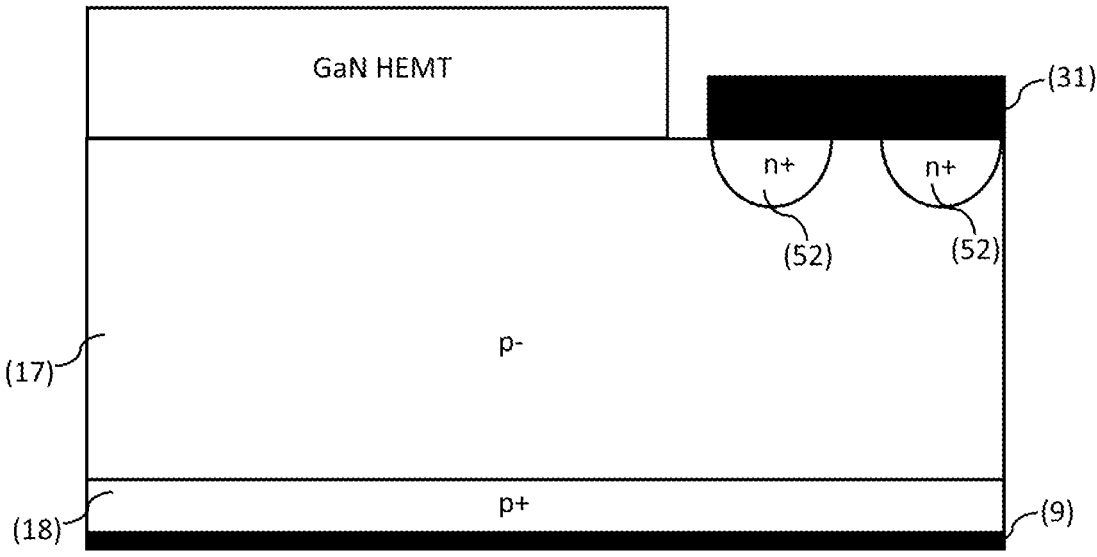
FIG. 31 depicts schematically a substrate with a Schottky contact according to further embodiments of the present disclosure.

FIG. 31 illustrates an additional embodiment. This embodiment comprises a Merged p-n Schottky (MPS) configuration with a Schottky contact (31), an p-drift region (17) and n+ regions (52) at the MPS anode.

Figure 32:
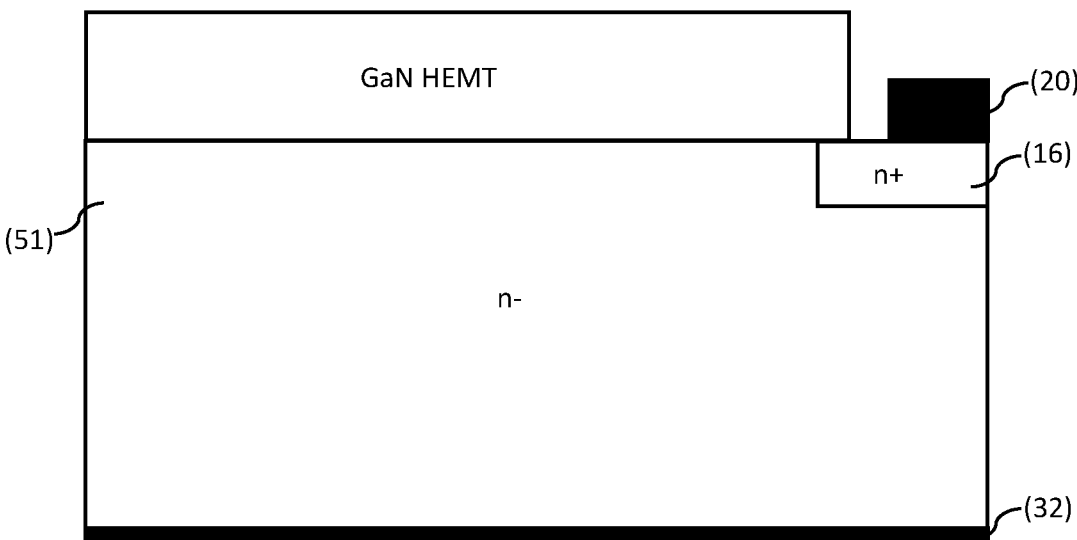
FIG. 32 depicts schematically a substrate with a Schottky contact according to further embodiments of the present disclosure.

FIG. 32 illustrates another embodiment of the SiC diode as a Schottky diode with a Schottky contact (32), a n-drift region (51) and a n+ cathode layer (16).

Figure 33:
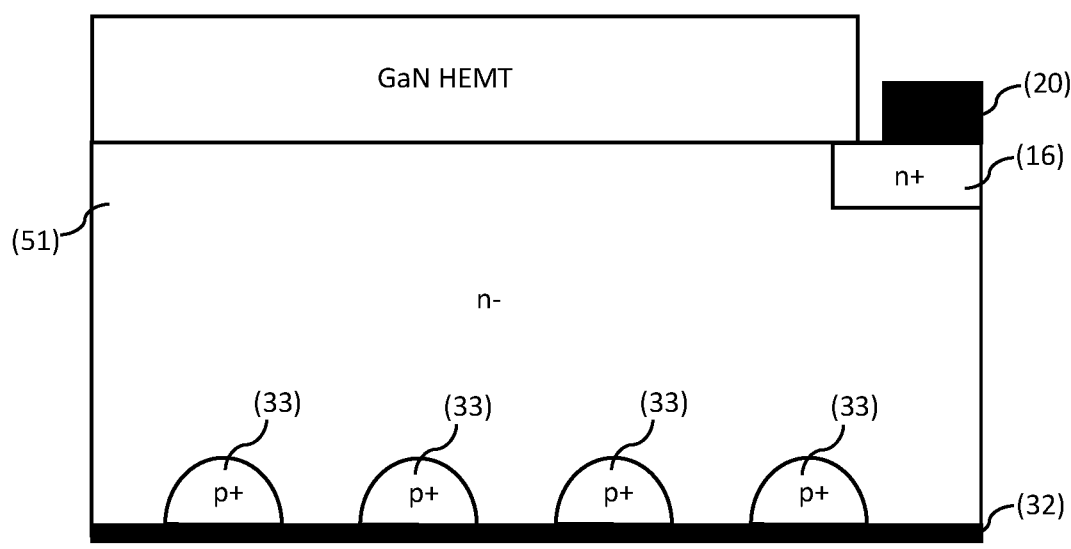
FIG. 33 depicts schematically a substrate with a Schottky contact according to further embodiments of the present disclosure.

FIG. 33 illustrates an additional embodiment which comprises a SiC Schottky diode. This embodiment comprises a Merged p-n Schottky (MPS) configuration with a Schottky contact (32), an n-drift region (51) and p+ regions (33) at the MPS anode.

Figure 34:
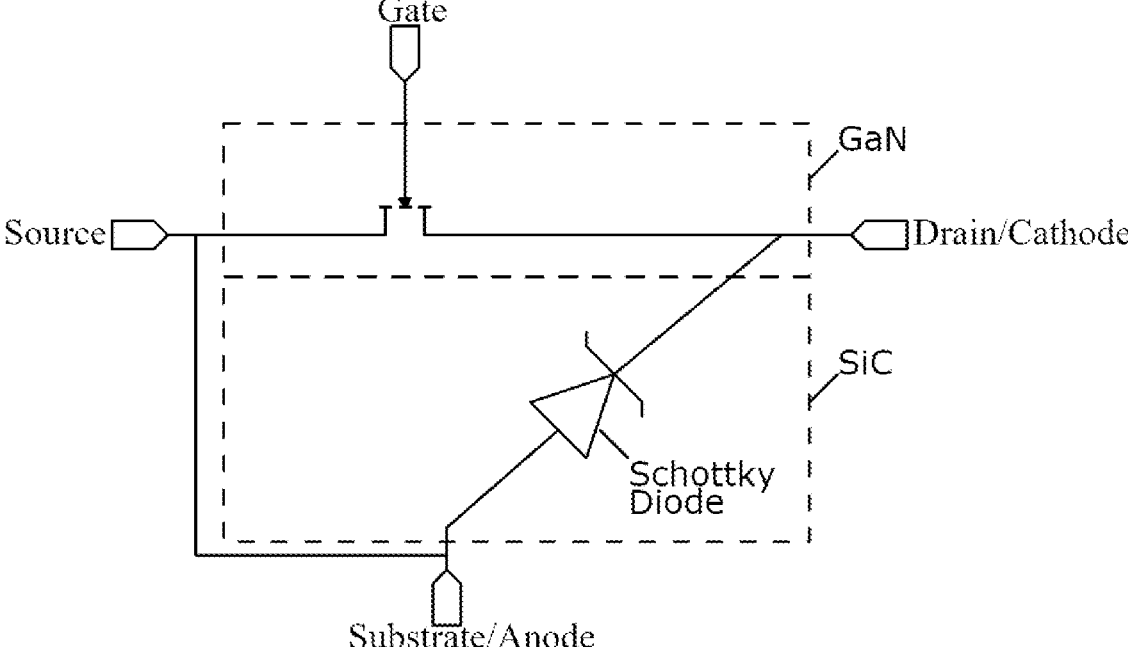
FIG. 34 depicts a circuit schematic of a GaN HEMT comprising the substrate of FIG. 33.

FIG. 34 illustrates a circuit schematic similar to FIG. 14. In FIG. 34, the SiC diode is a Schottky diode corresponding to the example device depicted in FIG. 33.

Figure 35:
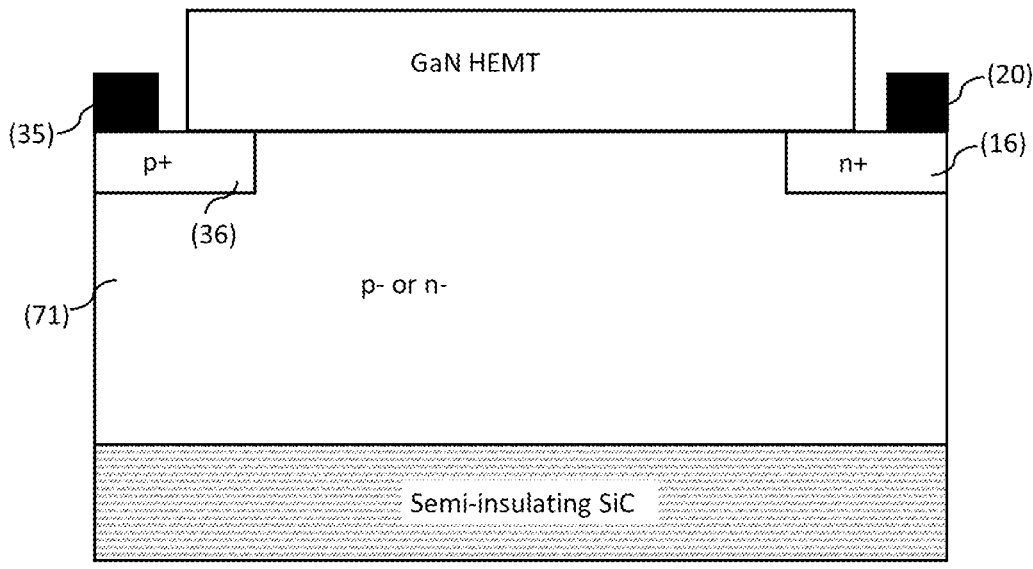
FIG. 35 depicts schematically a substrate comprising a lateral diode according to embodiments of the present disclosure.

FIG. 35 illustrates an additional embodiment which comprises a lateral SiC diode. The lateral SiC diode comprises an n+ region (16) and a contact (20) which acts as the anode and may be connected to drain potential as shown in previous examples. In this embodiment, the anode of the SiC diode which comprises a contact (35) is separated laterally from the cathode contact. The SiC diode, in this example, is a p+/p–/n+ or p+/n–/n+ diode, which comprises a p+ anode region (36) and a p- or n-drift region (71) as well as the n+ cathode region (16) presented in previous examples. The anode contact may be connected to the source terminal of the GaN HEMT. The lateral SiC diode may be formed on a semi-insulating SiC substrate or a doped SiC substrate.

Figure 36:
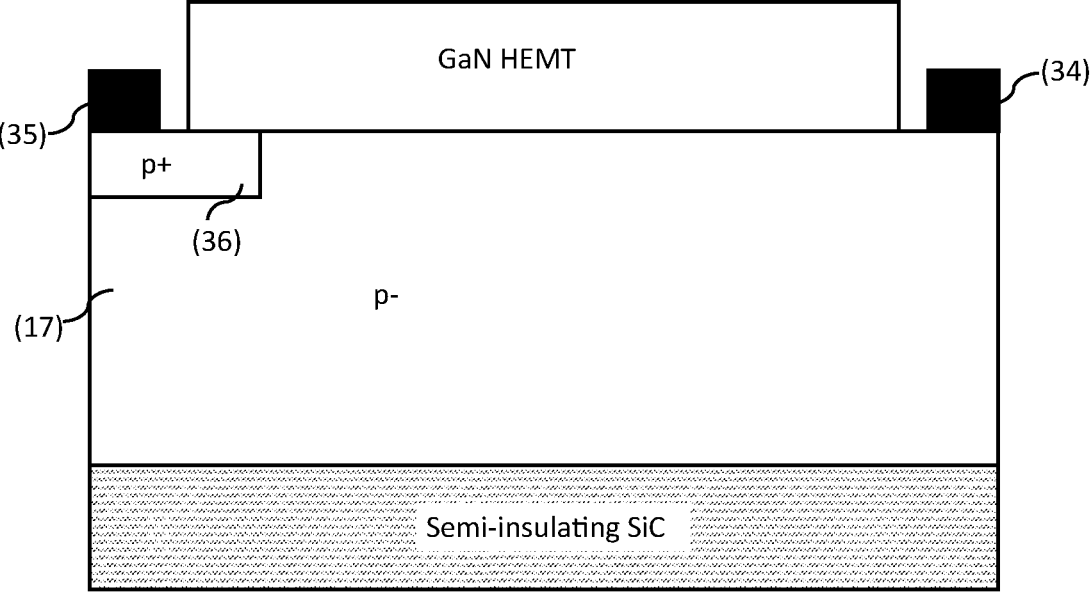
FIG. 36 depicts schematically a substrate comprising a lateral diode according to further embodiments of the present disclosure.

FIG. 36 illustrates an additional example of a lateral SiC diode. This example is a Schottky diode where the cathode contact 34 is a Schottky contact.

Figure 37:
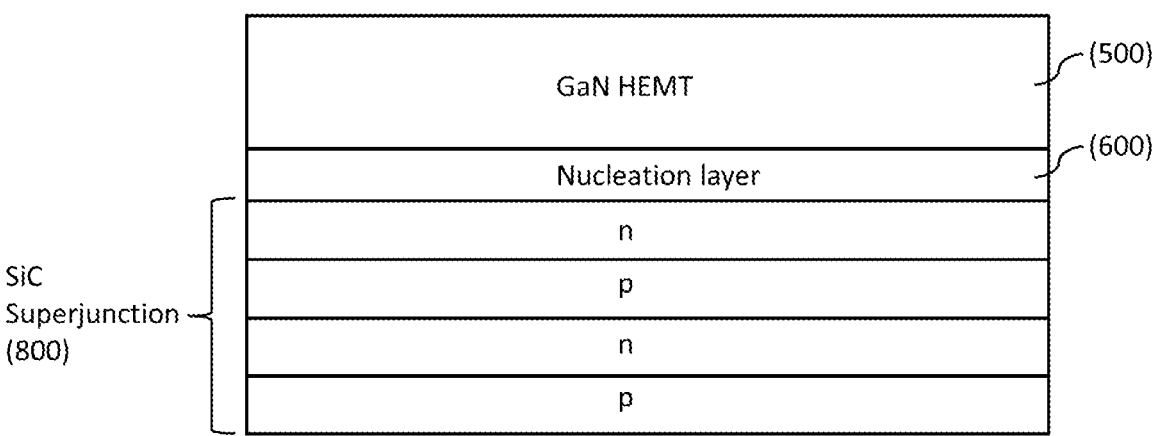
FIG. 37 depicts schematically a substrate comprising a SiC superjunction according to embodiments of the present disclosure.

FIG. 37 illustrates an additional embodiment according to the present disclosure. This embodiment illustrates a SiC superjunction (800) in the SiC substrate which comprises alternating n/p layers. The superjunction may be used in the SiC diode drift region to enable a more effective potential distribution during reverse bias conditions. When the superjunction is used as a drift region in a high voltage diode, the n and p layers deplete at high reverse voltages applied between the anode and cathode terminals. The superjunction structure is configured for charge compensation between the n and p layers to provide more uniform electric field and potential distribution during reverse bias.

Figure 38:
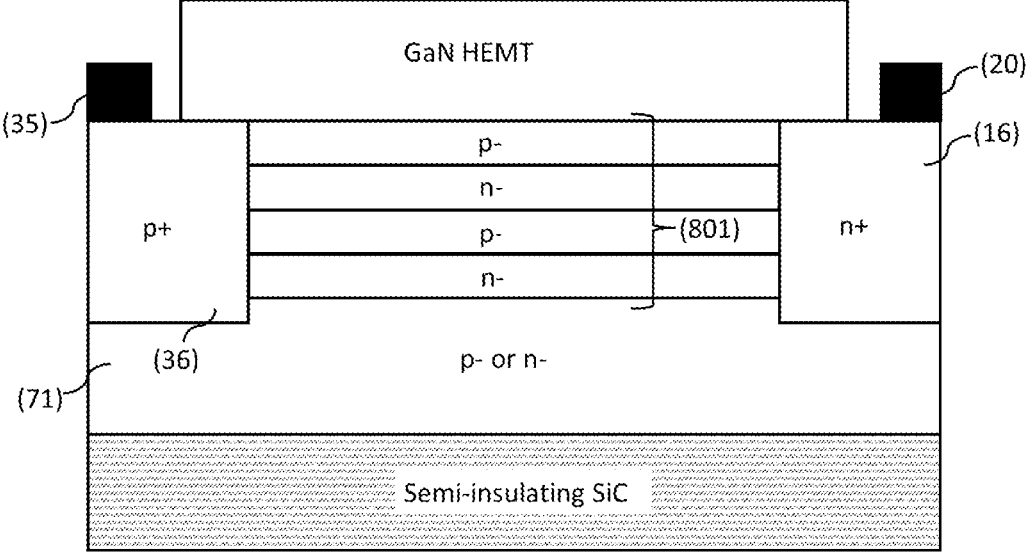
FIG. 38 depicts schematically a substrate comprising a lateral diode and a SiC superjunction according to embodiments of the present disclosure.

FIG. 38 illustrates an embodiment which comprises a SiC superjunction drift region (801) in a lateral SiC diode with an anode contact (35) and a cathode contact (20). Part (or the entirety) of the superjunction drift region is physically arranged directly under the active III-Nitride semiconductor region where the GaN HEMT is formed.

Figure 39:
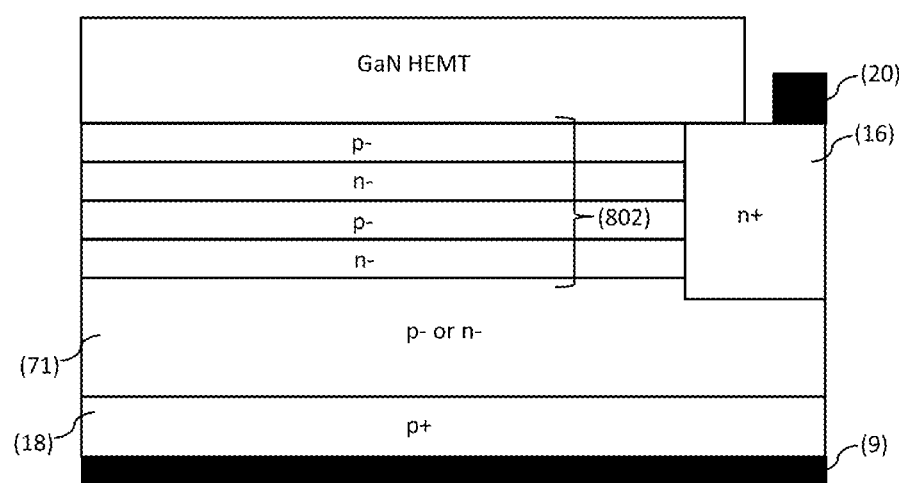
FIG. 39 depicts schematically a substrate comprising a vertical diode and a SiC superjunction according to embodiments of the present disclosure.

FIG. 39 illustrates an embodiment which comprises a SiC superjunction drift region (802) in a vertical SiC diode, where the anode is the back metallisation contact (9) and the cathode contact (20) is placed on the front end of the wafer.

Figure 40:
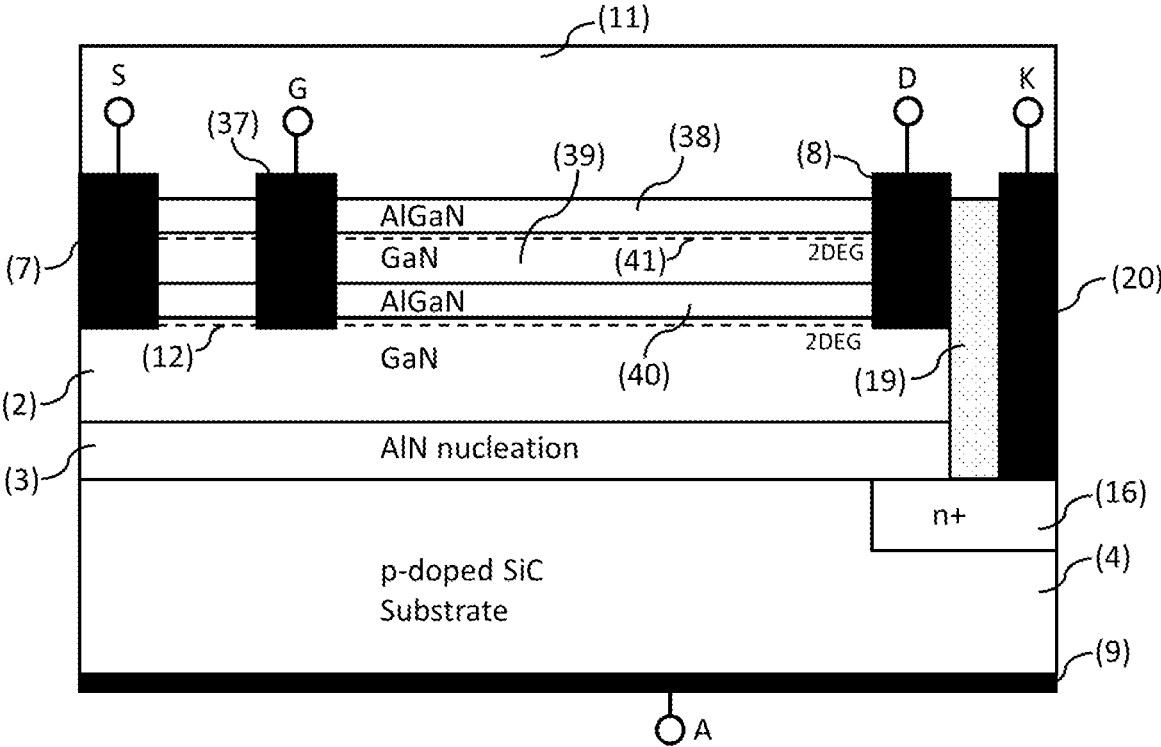
FIG. 40 depicts schematically a GaN HEMT according to further embodiments of the present disclosure.

FIG. 40 illustrates an additional embodiment which comprises a multichannel HEMT and a high voltage SiC diode. The example illustrated may be described as having two channels. More than two channels may be used in other examples. One 2DEG (12) is present at the interface of AlGaN (40)/GaN (2) and a second 2DEG (41) is present at the interface of AlGaN (38)/GaN (39). Gate (37) may be an insulated gate or other common gate technology for multichannel HEMTs.

Figure 41:
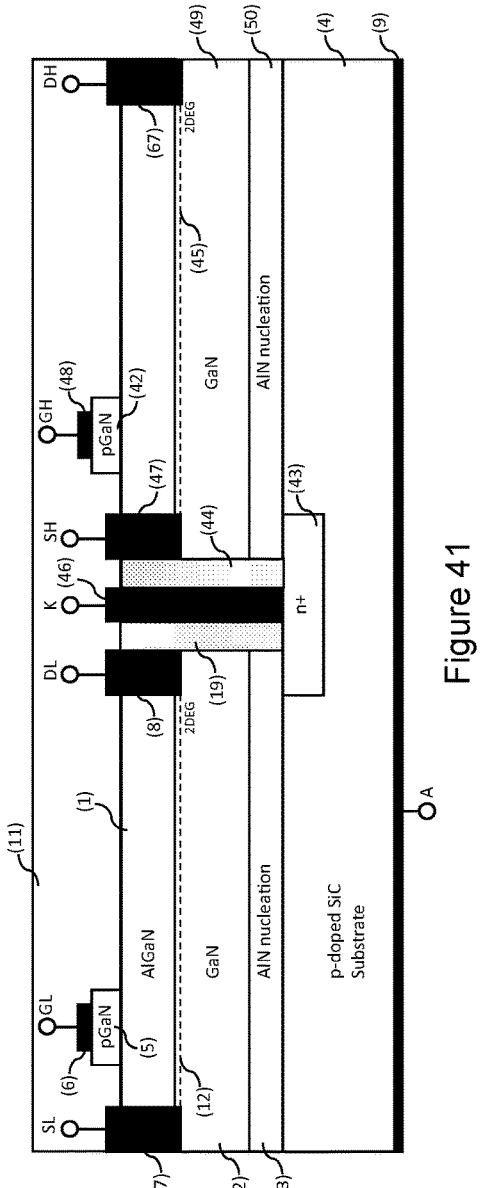
FIG. 41 depicts schematically a GaN HEMT in a half-bridge configuration according to embodiments of the present disclosure.

FIG. 41 illustrates an additional embodiment which comprises a GaN HEMT half bridge and a high voltage SiC diode.

Figure 42:
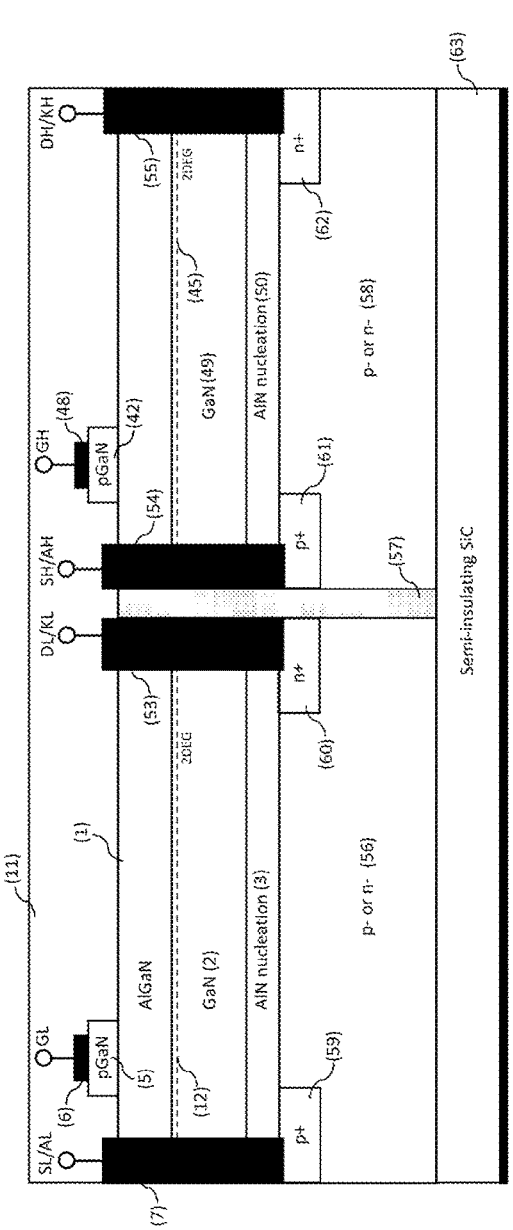
FIG. 42 depicts schematically a GaN HEMT in a half-bridge configuration according to further embodiments of the present disclosure.
Figure 43:
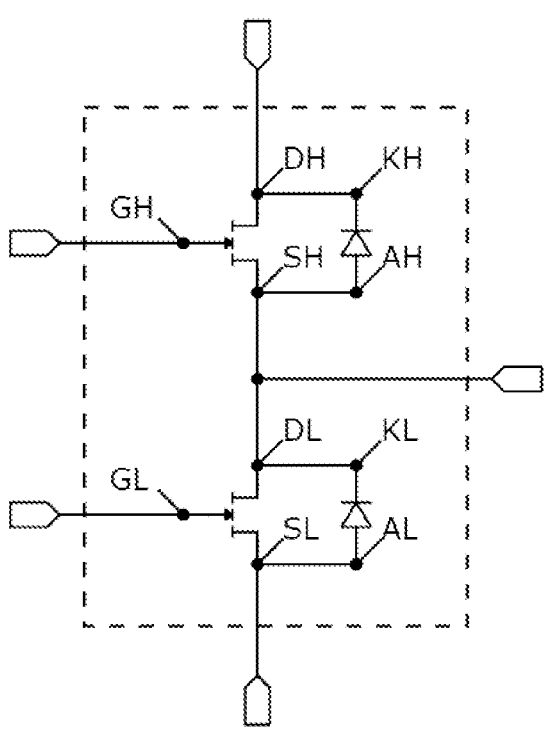
FIG. 43 depicts a circuit schematic of the device depicted in FIG. 42.

FIG. 42 illustrates an additional embodiment of a half bridge which comprises a low side GaN HEMT and associated GaN diode and a high side GaN HEMT and associated SiC diode. The devices may be formed on a semi-insulating SiC substrate. A p– or n– SiC drift region for the two diodes (56/58) may be present on the SiC substrate. The two regions may be isolated by an isolation region (57). An equivalent circuit schematic is illustrated in FIG. 43.

Figure 44:
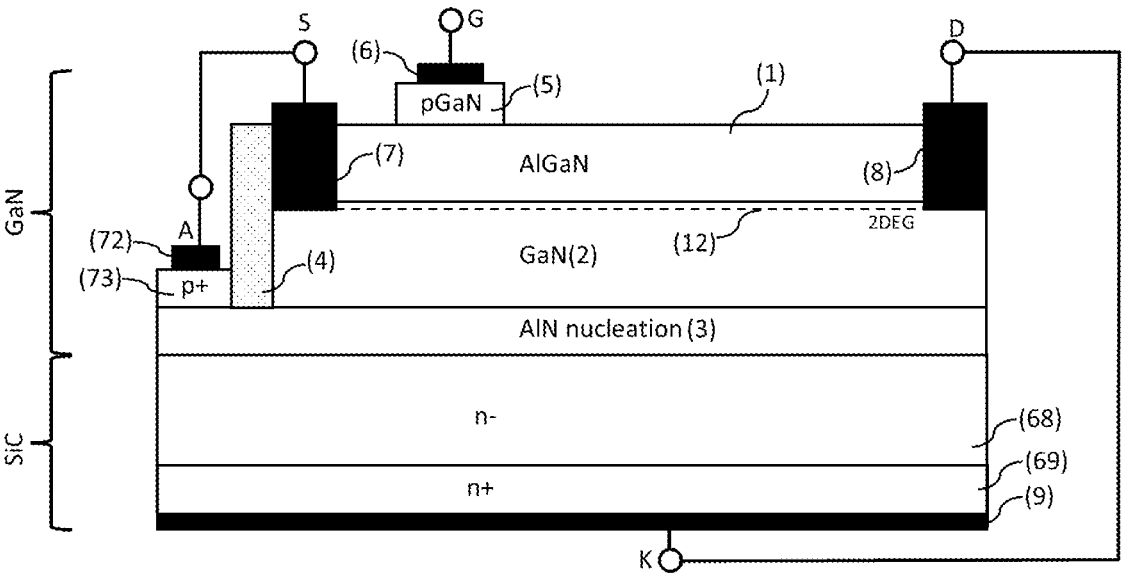
FIG. 44 depicts schematically a GaN HEMT with a diode partly in GaN and partly in the substrate according to further embodiments of the present disclosure.

FIG. 44 illustrates a schematic of an additional embodiment of a device according to the present disclosure. This embodiment comprises a p+ region (73) formed in GaN below the anode contact (72). The p+ region (73) and substrate layers (68), (69) therefore form a p+/n/n+ diode. The drift region and the cathode layers (68), (69) are formed in SiC while the anode layer (73) is formed in GaN. The p+ region (73) may be grown in the same process step as the pGaN region (5), which acts as the gate of the GaN HEMT. The same metallization as the gate terminal may (or may not) be used to form an anode contact (72) on the p+ region (73). The contact (72) on the p+ region (73) may be an ohmic or Schottky contact. The p+ region (73) may be epitaxially grown on the AlN nucleation layer (3) In implementations, the AlN nucleation layer may be extremely thin (e.g. with a thickness on the order of 20 nm to 100 nm). Alternatively, the GaN layer (2) and the p+ region (73) may be formed directly over the SiC substrate (68), (69), i.e. by excluding the nucleation layer (3) entirely. The p+ region (73) can be doped using e.g. Magnesium, or other suitable dopants.

Figure 45:
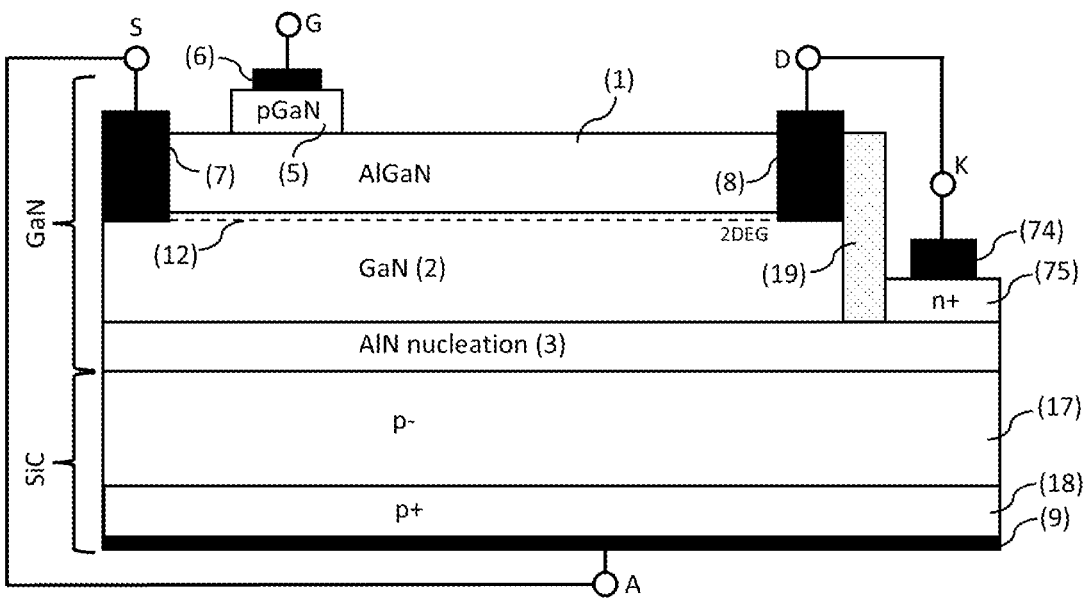
FIG. 45 depicts schematically a GaN HEMT according to further embodiments of the present disclosure.

FIG. 45 illustrates a schematic of a further embodiment. This embodiment comprises a n+ region (75) formed in GaN below the cathode contact (74). The n+ region (75) and SiC substrate layers (17), (18) therefore form a n+/p–/p+ diode in combination. The contact (74) on the n+ region (75) may be an ohmic or Schottky contact. The n+ region (75) may be epitaxially grown on the AlN nucleation layer (3). In implementations, the AlN nucleation layer (3) may be extremely thin (e.g. with a thickness on the order of 20 nm to 100 nm), or may be excluded entirely such that the GaN layer (2) and the n+ region (75) are formed directly over the SiC substrate (17), (18).

It will be understood that in implementations of the present invention, a power device may be a device that contains a high voltage transistor in a first wide bandgap semiconductor and a high voltage diode associated with the second-wide bandgap semiconductor.

It will be understood that in implementations of the present invention, a wide bandgap semiconductor may be any semiconductor with bandgap in excess of 2 eV.

It will be understood that in implementations of the present invention, a high voltage diode may be a diode associated with the substrate that features two terminals, anode and cathode and an n-type or p-type drift region, wherein the drift region is formed in the second wide bandgap semiconductor. The diode supports largely the voltage across the anode-cathode terminals when the diode is in reverse-bias (cathode terminal positively biased with respect to the anode terminal).

It will be understood that in implementations of the present invention, the substrate may be a region that comprises a second wide bandgap semiconductor and wherein the drift region of the diode is formed. The substrate may offer a mechanical support to the transistor. The substrate can be connected or connectable to a backside electrical terminal and may be attached to a heat sink.

It will be understood that in implementations of the present invention, the active area may be an area within the high voltage transistor that is active in all steady-state and transient modes and wherein in particular on-state conduction takes place.

It will be understood that in implementations of the present invention, the isolation region may be a region(s) within the power device outside the active areas, where the on-state conduction does not take place.

It will be understood that in implementations of the present invention, the heterojunction transistor may be a high voltage transistor in a first wide bandgap semiconductor, wherein the wide bandgap semiconductor may contain several layers/regions of IIII-nitride and at least one heterojunction interface between GaN and AlGaN where a 2DEG is formed. In examples, the heterojunction transistor may be a GaN HEMT, but other suitable transistors may also be used.

It will be understood that in implementations of the present invention, the semiconductor active region may be a region within the active area of the device which comprises a GaN/AlGaN heterojunction, and where the terminals of the heterojunction transistor, source, drain are operatively connected and the gate terminal of the heterojunction transition is positioned over.

It will be understood that in implementations of the present invention, a SiC substrate may be a substrate that comprises 4H SiC, 6H SiC, 3C SiC and/or semi insulating SiC materials.

It will be understood that in implementations of the present invention, a HEMT or GaN HEMT may be a heterojunction transistor that is a high electron mobility transistor made in Gallium nitride (or III-Nitride semiconductor) that contains a 2DEG between a source and a drain terminal, controlled by a gate terminal.

It will be understood that in implementations of the present invention, a p+ anode layer may be a layer within the high voltage diode is that is heavily doped with acceptor type ions (p-type ions) and that is connected to the anode terminal.

It will be understood that in implementations of the present invention, a n+ cathode layer may be a layer within the high voltage diode is that is heavily doped with donor type ions (n-type ions) and that is connected to the cathode terminal.

It will be understood that in implementations of the present invention, a p-GaN may be a region that is formed within a GaN semiconductor with p-type doping.

It will be understood that in implementations of the present invention, an anti-parallel diode may be a high voltage diode that has the anode terminal connected to the source terminal of the high voltage transistor and the cathode terminal connected to the anode terminal of the high voltage transistor.

It will be understood that in implementations of the present invention, a superjunction may be a structure formed of vertically or laterally alternating n and p doped layers. When the superjunction is used as a drift region in a high voltage diode, the n and p layers deplete at high reverse voltages applied between the anode and cathode terminals. The superjunction structure is configured for charge compensation between the n and p layers to provide more uniform electric field and potential distribution during reverse bias.

The skilled person will understand that in the preceding description and appended claims, positional terms such as 'top', 'front', 'side', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A power device comprising:
a substrate comprising a p-doped SiC material, the substrate comprising a first surface and a second surface opposite the first surface;
a high voltage heterojunction transistor formed over the first surface of the substrate, the high voltage heterojunction transistor comprising:
a III-nitride semiconductor region comprising a heterojunction formed between a GaN layer and an AlGaN layer;
a drain terminal operatively connected to the III-nitride semiconductor region;
a source terminal laterally spaced from the drain terminal and operatively connected to the III-nitride semiconductor region; and
a gate terminal positioned over the III-nitride semiconductor region, the gate terminal being formed between the drain terminal and the source terminal;
a high voltage diode comprising:
a first p-doped region with a first doping density, the first p-doped region associated with the substrate,
a second p-doped region with a second doping density, wherein the second doping density is less than the first doping density, the second p-doped region positioned between the first p-doped region and the first surface and forming a drift region for the high voltage diode such that at least part of the drift region is directly under and in physical contact with the high voltage heterojunction transistor; and
an anode terminal operatively connected to the second surface of the substrate and to the source terminal; and
a cathode terminal operatively connected to the first surface of the substrate and to the drain terminal.

2. The power device according to claim 1, wherein the power device is configured such that when a higher voltage is applied between the drain terminal with respect to the source terminal of the heterojunction transistor, the high voltage diode is in a reverse bias mode thereby blocking a substantial fraction of an applied voltage within the drift region.

3. The power device according to claim 1, wherein the power device is configured such that, when a high voltage is applied across the drain and source terminals, the high voltage diode is reverse biased and supports a large depletion layer within the doped region; and
wherein at least part of the depletion layer is formed below an active region, wherein the depletion layer is configured to contribute to supporting a voltage between the drain terminal of the heterojunction transistor and an anode terminal of the high voltage diode.

4. The power device according to claim 1, wherein the substrate comprises:
a n-doped region operatively connected to a cathode terminal.

5. The power device according to claim 4, wherein the n-doped region has a third doping density that is greater than the second doping density.

6. The power device according to claim 4, wherein the cathode terminal at least partially extends into the substrate from the first surface, and wherein the n-doped region is positioned to surround the cathode terminal within the substrate.

7. The power device according to claim 1, wherein a cathode forms at least in part a Schottky contact to the substrate.

8. The power device according to claim 7, wherein the high voltage diode is a Schottky diode, and wherein the Schottky contact is positioned between adjacent highly doped n-type regions.

9. The power device according to claim 1, wherein the high voltage diode is configured as an anti-parallel diode for the heterojunction transistor, the high voltage diode further being configured to become forward-biased when the heterojunction transistor operates in a reverse conduction mode.

10. The power device according to claim 9, wherein the anti-parallel diode is configured to provide an extra current path during the reverse conduction mode of the heterojunction transistor, either as a main anti-parallel diode, as a surge diode, or as a diode in parallel with an intrinsic reverse conduction structure of the heterojunction transistor.

11. The power device according to claim 1, where the heterojunction comprises at least one active two dimensional carrier gas channel.

12. The power device according to claim 1, further comprising a second heterojunction transistor positioned over the substrate, the second heterojunction transistor comprising:

a second active region comprising a second heterojunction formed between a second GaN layer and a second AlGaN layer;

a second drain terminal operatively connected to the second active region;

a second source terminal laterally spaced from the second drain terminal and operatively connected to the second active region; and a second gate terminal positioned over the second active region, the second gate terminal being formed between the second drain terminal and the second source terminal.

13. The power device according to claim 1, comprising one or more integrated low-voltage devices or circuits, the low-voltage circuits positioned either:

(i) adjacent to the heterojunction transistor;

(ii) in the substrate adjacent to the heterojunction transistor; or (iii) adjacent to the high voltage diode.

14. The power device according to claim 1, wherein the substrate comprises a superjunction structure formed of laterally or vertically alternating n and p doped layers positioned between the first and second p-doped regions, the superjunction structure positioned below at least part of the heterojunction transistor.

15. The power device according to claim 1, wherein at least a cathode terminal is operatively connected to a fixed high voltage rail, or an anode terminal is operatively connected to a low voltage DC terminal.

* * * * *